(12) United States Patent
Miwa et al.

(10) Patent No.: US 9,147,913 B2
(45) Date of Patent: Sep. 29, 2015

(54) DIAGNOSIS SYSTEM AND DIAGNOSIS METHOD FOR LITHIUM ION SECONDARY BATTERY

(75) Inventors: Toshiharu Miwa, Yokohama (JP); Seiji Ishikawa, Kawasaki (JP); Chizu Matsumoto, Fujisawa (JP)

(73) Assignee: HITACHI, LTD., Tokyo (JP)

(*) Notice: Subject to any disclaimer, the term of this patent is extended or adjusted under 35 U.S.C. 154(b) by 787 days.

(21) Appl. No.: 13/508,750

(22) PCT Filed: Nov. 8, 2010

(86) PCT No.: PCT/JP2010/069820
§ 371 (c)(1),
(2), (4) Date: Jun. 29, 2012

(87) PCT Pub. No.: WO2011/055818
PCT Pub. Date: May 12, 2011

(65) Prior Publication Data
US 2012/0259569 A1    Oct. 11, 2012

(30) Foreign Application Priority Data
Nov. 9, 2009  (JP) .................... 2009-256229

(51) Int. Cl.
| | | |
|---|---|---|
| H01M 10/04 | (2006.01) | |
| G01R 31/36 | (2006.01) | |
| H01M 10/48 | (2006.01) | |
| H01M 10/42 | (2006.01) | |
| H01M 10/44 | (2006.01) | |
| H01M 10/0525 | (2010.01) | |

(52) U.S. Cl.
CPC ............ *H01M 10/482* (2013.01); *H01M 10/04* (2013.01); *H01M 10/4207* (2013.01); *H01M10/4221* (2013.01); *H01M 10/4285* (2013.01); *H01M 10/441* (2013.01); *G01R 31/3641* (2013.01); *H01M 10/0525* (2013.01)

(58) Field of Classification Search
CPC .................................................... H01M 10/04
USPC ................................................... 702/63
See application file for complete search history.

(56) References Cited

U.S. PATENT DOCUMENTS

| | | | | |
|---|---|---|---|---|
| 7,151,366 B2 * | 12/2006 | Renken et al. | ........... | 324/750.02 |
| 7,710,073 B2 * | 5/2010 | Yamauchi et al. | ............ | 320/128 |
| 2006/0152224 A1 | 7/2006 | Kim et al. | | |

FOREIGN PATENT DOCUMENTS

| | | |
|---|---|---|
| JP | 10-312823 | 11/1998 |
| JP | 2000-156248 | 6/2000 |

(Continued)

*Primary Examiner* — Bryan Bui
(74) *Attorney, Agent, or Firm* — Baker Botts L.L.P.

(57) ABSTRACT

Manufacturing management information relating to a module battery and single battery mounted therein which are obtained in a battery manufacturing process (1) is collected by a manufacturing quality information collection processing unit (4) and stored in a database (6). In a battery diagnosis system (3), when the module battery (2) under a usage environment is charged, an operation result processing unit (5) collects operation result information relating to the module (2) and stores the operation result information in a database (7). An operation result monitoring processing unit (8) determines whether the operation result information is abnormal, and supplies the result of the determination to a manufacturing/usage environment factor classification processing unit (9). When the result of the determination indicates that the operation result information is abnormal, the manufacturing/usage environment factor classification processing unit (9) diagnoses, on the basis of the manufacturing management information relating to the module battery in the database (6), whether the abnormality of the operation result information is caused by a manufacturing factor or a usage environment factor, and the result of the diagnosis is created and displayed by the diagnosis result creation processing unit (10).

7 Claims, 24 Drawing Sheets

(56) References Cited

FOREIGN PATENT DOCUMENTS

| JP | 2003-167653 | 6/2003 |
| JP | 2005-43059 | 2/2005 |
| JP | 2006-524332 | 10/2006 |
| JP | 2006-331976 | 12/2006 |
| JP | 2007-026844 | 2/2007 |
| JP | 2009-81078 | 4/2009 |
| JP | 2010-45002 | 2/2010 |

* cited by examiner

FIG. 8

| SINGLE BATTERY CONTROL NUMBER | WINDING DATE AND TIME | POSITIVE ELECTRODE | | | | | NEGATIVE ELECTRODE | | | | | SEPARATOR |
|---|---|---|---|---|---|---|---|---|---|---|---|---|
| | | CONTROL NUMBER | BLENDING MATERIAL 1 CONTROL NUMBER | BLENDING MATERIAL 2 CONTROL NUMBER | ... | | CONTROL NUMBER | BLENDING MATERIAL 1 CONTROL NUMBER | BLENDING MATERIAL 2 CONTROL NUMBER | ... | | CONTROL NUMBER |
| B01 | | P01 | PC1-01 | PC2-01 | | | N01 | NC1-01 | NC2-01 | | | S01 |
| B02 | | | | | | | | | | | | |
| B03 | | P02 | | PC2-02 | | | | | | | | |
| B04 | | | | | | | N02 | NC2-02 | NC2-02 | | | S02 |
| B05 | | | | | | | | | | | | |
| B06 | | | | | | | | | | | | S03 |

| SINGLE BATTERY CONTROL NUMBER | INSPECTION DATE AND TIME | INSPECTION ITEM | | |
|---|---|---|---|---|
| | | VOLTAGE | CURRENT | CAPACITANCE | ... |
| B01 | 2009/7/13 00:00 | | | | |
| B02 | 2009/7/13 06:00 | | | | |
| B03 | 2009/7/13 12:00 | | | | |
| B04 | 2009/7/14 00:00 | | | | |
| B05 | 2009/7/14 06:00 | | | | |
| B06 | 2009/7/14 12:00 | | | | |

FIG. 10

| MODULE CONTROL NUMBER (22a) | ASSEMBLING DATE AND TIME (22b) | SINGLE BATTERY CONTROL NUMBER (22c) | CONTROLLER CONTROL NUMBER (22d) |
|---|---|---|---|
| M01 | 2009/07/15 00:00 | B01 | C01 |
| | | B02 | |
| | | B03 | |
| | | B04 | |
| M02 | 2009/07/16 00:00 | B05 | C02 |
| | | B06 | |
| | | B07 | |
| | | B08 | |

FIG. 11

| MODULE CONTROL NUMBER | INSPECTION DATE AND TIME | INSPECTION ITEM | | | |
|---|---|---|---|---|---|
| | | VOLTAGE | CURRENT | CAPACITANCE | ... |
| M01 | | | | | |
| M02 | | | | | |
| M03 | | | | | |
| M04 | | | | | |
| M05 | | | | | |
| M06 | | | | | |

FIG. 12

| MODULE CONTROL NUMBER | CHARGING DATE AND TIME | CUMULATIVE NUMBER OF TIMES OF CHARGE CYCLES | ELAPSED TIME | MEASUREMENT ITEM | | | |
|---|---|---|---|---|---|---|---|
| | | | | VOLTAGE | CURRENT | CAPACITANCE | ... |
| M01 | | 10 | | | | | |
| M01 | | 100 | | | | | |
| M01 | | 300 | | | | | |
| M02 | | 50 | | | | | |
| M02 | | 200 | | | | | |
| M02 | | 250 | | | | | |

FIG. 13

| MODULE CONTROL NUMBER 22a | SINGLE BATTERY CONTROL NUMBER 25a | CHARGING DATE AND TIME 25b | CUMULATIVE NUMBER OF TIMES OF CHARGE/ DISCHARGE CYCLES 25c | CUMULATIVE ELAPSED TIME 25d | MEASUREMENT ITEM 25e ||||
|---|---|---|---|---|---|---|---|---|
| | | | | | VOLTAGE | CURRENT | CAPACITANCE | ... |
| M01 | B01 | | 10 | | | | | |
| | B02 | | | | | | | |
| | B03 | | | | | | | |
| | B04 | | | | | | | |
| M02 | | | 100 | | | | | |
| | | | | | | | | |

FIG. 18

| MODULE CONTROL NUMBER | SINGLE BATTERY CONTROL NUMBER | OPERATION ABNORMALITY | POSITIVE ELECTRODE | | | ... | NEGATIVE ELECTRODE | | | ... |
|---|---|---|---|---|---|---|---|---|---|---|
| | | | CONTROL NUMBER | BLENDING MATERIAL 1 | BLENDING MATERIAL 2 | | CONTROL NUMBER | BLENDING MATERIAL 1 | BLENDING MATERIAL 2 | |
| M01 | B01 | PRESENT | P01 | PC1-01 | PC2-01 | | N01 | NC1-01 | NC1-01 | |
| | B02 | PRESENT | P01 | PC1-01 | PC2-01 | | N01 | NC1-01 | NC1-01 | |
| | B03 | PRESENT | P01 | PC1-01 | PC2-01 | | N01 | NC1-01 | NC1-01 | |
| | B04 | ABSENCE | P02 | PC1-01 | PC2-02 | | N02 | NC1-02 | NC2-02 | |
| | B05 | ABSENCE | P02 | PC1-01 | PC2-02 | | N02 | NC1-02 | NC2-02 | |
| | B06 | ABSENCE | P02 | PC1-01 | PC2-02 | | N02 | NC1-02 | NC2-02 | |

FIG. 21

MANUFACTURING FACTOR ITEM :
  POSITIVE ELECTRODE, BLENDING MATERIAL 1 (CONTROL NUMBER : PC1-01 )
MANUFACTURING INSPECTION DATA ITEM :
  CAPACITANCE DURING INSPECTION BEFORE SHIPPING

| MODULE CONTROL NUMBER | SINGLE BATTERY CONTROL NUMBER | OPERATION ABNOR- MALITY | INSPECTION DATA VALUE | THE PRESENCE OR ABSENCE OF ABNORMALITY |
|---|---|---|---|---|
| M01 | B01 | PRESENT | 10 | PRESENT |
| M01 | B02 | PRESENT | 10.5 | PRESENT |
| M01 | B03 | PRESENT | 9.8 | PRESENT |
| M01 | B15 | — | 9.8 | PRESENT |
| M01 | B16 | — | 9.7 | PRESENT |
| M01 | B17 | — | 10.1 | PRESENT |

FIG. 22

- 27a — DIAGNOSIS DATE AND TIME
- 27b — MODULE CONTROL NUMBER
- 27c — SINGLE BATTERY CONTROL NUMBER
- 27d — OPERATION RESULT DETERMINATION
- 27e — MANUFACTURING FACTOR DETERMINATION
- 27f — MANUFACTURING FACTOR ITEM
- 27g — ABNORMAL CANDIDATE SINGLE BATTERY

DIAGNOSIS SYSTEM AND DIAGNOSIS METHOD FOR LITHIUM ION SECONDARY BATTERY

INCORPORATION BY REFERENCE

The present application claims priority from the prior Japanese Patent Application No. 2009-256229 filed on Nov. 9, 2009, the content of which is hereby incorporated by reference into this application.

TECHNICAL FIELD

The present invention relates to a diagnosis system which diagnoses a chargeable lithium ion secondary battery and a diagnosis method thereof.

BACKGROUND ART

A lithium ion secondary battery will be first described.

FIG. 2 schematically illustrates an operation principle of a lithium ion secondary battery, and a reference numeral 100 denotes a lithium ion secondary battery, a reference numeral 100a denotes a battery can, a reference numeral 101 denotes a positive electrode, a reference numeral 101a denotes a positive electrode active material, a reference numeral 102 denotes a negative electrode, a reference numeral 102a denotes a negative electrode active material, a reference numeral 103 denotes a separator, and a reference numeral 104 denotes an electrolyte.

In FIG. 2, the lithium ion secondary battery 100 has a configuration in which the positive electrode 101 having an active material 101a of a metal oxide such as lithium, the negative electrode 102 having an active material 102a of a carbon material, the electrolyte 104 having an organic solvent and a lithium salt, and the separator 103 are placed within the electrode can 100a. The positive electrode 101 and the negative electrode are film-formed, and form a cylindrical electrode pair corresponding to a cylindrical shape of the electrode can 100a with a film-like separator 103 interposed therebetween. Such an electrode pair is placed in the electrolyte 104 which is injected into the electrode can 100a. One electrode pair having the positive electrode 101 and the negative electrode 102 is here illustrated within the electrode can 100a; however, a plurality of the electrode pairs are provided and these are connected to in series each other.

In the lithium ion secondary battery 100 having such a configuration, when a lithium ion moves between the positive electrode 101 and the negative electrode 102, charging and discharging is performed. When the charging is performed under a usage environment, a lithium ion of the positive electrode 101 moves to the negative electrode 102 and the charging is performed. When the discharging is performed under a usage environment, a lithium ion of the negative electrode 102 moves to the positive electrode 101. As described above, the lithium ion secondary battery 100 has an operation principle without a chemical reaction in terms of the principle, and therefore has a feature in which a life is long and energy efficiency is high.

Hereinafter, one lithium ion secondary battery having a configuration illustrated in FIG. 2 is referred to as a "single battery", and one lithium ion secondary battery having a configuration in which a plurality of the single batteries are incorporated thereinto is referred to as a "module battery".

FIG. 3 schematically illustrates a manufacturing process of the single battery and module battery of the lithium ion secondary battery.

In FIG. 3, the manufacturing process of the lithium ion secondary battery 100 includes a positive electrode material manufacturing process 110, a negative electrode material manufacturing process 111, an assembling process of the single battery 112, and an assembling process of the module battery 113.

In the positive electrode material manufacturing process 110, various materials as a raw material of the positive electrode material are kneaded, blended, and slurry materials are prepared. After the slurry materials are coated on a film-like metallic foil, processing such as compression and cutting is performed to the metallic foil on which the slurry materials are coated, and the film-like positive electrode materials are manufactured.

Various materials as a raw material used in the negative electrode material manufacturing process 111 are different from those in the positive electrode material manufacturing process 110, however, procedures are the same as each other. Various materials as a raw material of the negative electrode material are kneaded, blended, and slurry materials are prepared (kneading and blending). After the slurry materials are coated on a film-like metallic foil (coating), processing such as compression and cutting is performed to the metallic foil on which the slurry materials are coated (processing), and the film-like negative electrode materials are manufactured.

In the assembling process 112 of the single battery of the lithium ion secondary battery, a positive electrode and a negative electrode having a size necessary for the single battery are cut out from the film-like positive electrode materials and negative electrode materials in a process referred to as winding. At the same time, a separator having a size necessary for the single battery is cut out from the film-like separator materials for separating these positive electrode materials and negative electrode materials, and these positive electrode and negative electrode are wound in piles with the separator interposed therebetween (winding). A group of the electrode pair of the wound positive electrode, negative electrode, and separator is assembled and welded. After a group of the electrode pair is arranged in the electrode can into which an electrolyte is poured (pouring), this battery can is completely sealed (sealing). In this way, the single battery is manufactured.

Next, the charging and discharging is repeated in the single battery of this manufactured lithium ion secondary battery, and an inspection relating to the performance and reliability of the single battery of this lithium ion secondary battery is performed (single battery inspection). Through the process, the single battery is completed and the single battery assembling process is terminated.

Next, in the module battery assembling process 113, a plurality of the single batteries are assembled in series, and further the controller is connected thereto to manufacture the module battery (module assembling). Thereafter, an inspection relating to the performance and reliability of the module battery of the lithium ion secondary battery is performed (module inspection). Through the process, the module battery of the lithium ion secondary battery is completed and shipped.

FIG. 4 is a flowchart illustrating a procedure of a method for charging the lithium ion secondary battery. This charging method is performed at the time of the "charging and discharging" and "single battery inspection" in the single battery assembling process 112 of FIG. 3, and at the time of the "module inspection" in the module battery assembling process 113.

In FIG. 4, when the lithium ion secondary battery is loaded in the charging device, a check of the connection is performed (step S100) and a check of the temperature is performed (step S101). If abnormality is not present in the checks, a voltage of the lithium ion secondary battery before the charging is measured (step S102). If the connection state, temperature, and voltage of the lithium ion secondary battery before the charging are deviated from a predetermined range ("No" at steps S100, S101, and S103), it is determined that the lithium ion secondary battery is abnormal and the charging processing is terminated (step S107).

If the connection state, temperature, and voltage of the lithium ion secondary battery before the charging fall within the predetermined range and are normal ("Yes" at steps S100, S101, and S103), a constant voltage is applied to the lithium ion secondary battery to perform the charging (step S104). During the charging processing, while the time necessary for the charging is checked, a current of the lithium ion secondary battery is measured, and until a current value becomes smaller than a predetermined value, the charging processing is repeated (repetition of step S105, "No" at step S106, and step S104). Before the charging time reaches a predetermined value ("Yes" at step S105), when the current value becomes smaller than the predetermined value ("Yes" at step S106), it is determined that the lithium ion secondary battery is normally charged, and the charging is terminated. However, even if the charging time reaches the predetermined value, when the current value fails to become smaller than the predetermined value ("No" at step S105), it is determined that the abnormality is present and the charging processing is terminated (step S107).

In this way, the module battery of the lithium ion secondary battery in which a normal charging result is obtained is shipped in a charged state and used under a usage environment by a user who purchases it.

FIGS. 5A and 5B schematically illustrate a transition of the voltage and current during the charging processing of the lithium ion secondary battery.

The voltage of the lithium ion secondary battery during the charging increases following the charging processing. On the other hand, while keeping a constant state, the charging current is rapidly reduced at a stage in which the charging is nearer to the completion.

When the charging of the lithium ion secondary battery is performed, a voltage normally remains in the secondary battery. FIG. 5A illustrates a transition of the voltage and current during the charging processing at the time when a start voltage of the charging is set to the residual voltage of the lithium ion secondary battery. In this case, when the lithium ion secondary battery is loaded in the charging device, the charging processing is immediately performed.

As compared with the above, in FIG. 5B, when the lithium ion secondary battery is loaded in the charging device, an electricity which remains in the lithium ion secondary battery is first discharged and the residual voltage is set to zero volt. Thereafter, this zero volt is set as the charging start voltage, and the charging processing is started. In this case, the charging current first flows from the lithium ion secondary battery, and thereafter the voltage increases following the charging processing as described above. On the other hand, while keeping a constant state, the charging current is rapidly reduced at the stage in which the charging is nearer to the completion.

The lithium ion secondary battery is used by repeating the charging and discharging. For the purpose of securing safety and reliability of the lithium ion secondary battery, the voltage and current of the lithium ion secondary battery during the charging or discharging are measured. A diagnosis for grasping whether a problem arises in the performance of the lithium ion secondary battery is performed based on the measurement result.

As one conventional example, there is proposed a technique in which an internal impedance is calculated based on a voltage and current of the battery and a life of the battery is diagnosed (see, for example, JP-A-2006-524332).

As another conventional example, there is also proposed a technique in which voltage and current characteristics during charging and discharging are measured, a characteristic factor is digitized from a measurement result of characteristic impedance to a predetermined frequency zone, and a state of a battery is diagnosed, and further a battery used in a module according to the battery characteristic is selected also in a manufacturing process in order to secure safety and reliability (see, for example, JP-A-2000-156248).

As another conventional example, there is further proposed a technique of classifying a single battery having a similar spectrum based on an impedance spectrum of the battery by using a pattern matching technique and improving reliability of a module battery by selecting the single battery so as to reduce a standard variation in the module battery (see, for example, JP-A-10-312823).

CITATION LIST

Patent Literature

Patent Literature 1: JP-A-2006-524332
Patent Literature 2: JP-A-2000-156248
Patent Literature 3: JP-A-10-312823

SUMMARY OF INVENTION

Technical Problem

High safety and reliability is necessary for a lithium ion secondary battery. In the manufacturing process, a potential of reduction in the safety and reliability of products is present due to degradation in uniformity of materials and mixing of foreign matters. Therefore, an inspection is performed for each single battery and module battery in a final process of the manufacturing process, and a battery having a manufacturing failure is selected. Performance of a module battery after the shipping is deteriorated according to a usage condition. A degree of the degradation in a battery is determined by a manufacturing variation in a usage environment and manufacturing process of the individual module battery. The degradation due to the usage environment is unavoidable as a variation per hour. However, a difference of the degree of the degradation due to a manufacturing process can be handled by an improvement of the manufacturing process.

The module battery having a manufacturing history as a manufacturing factor further has a high potential of performance degradation acceleration. As compared with other module batteries, measures such as an early exchange are important. In a conventional known technique, the individual degradation degree can be grasped by monitoring a state of the individual module battery or single battery, however, a degradation factor which is classified into manufacturing and usage environment fails to be specified.

Accordingly, it is an object in one aspect of the embodiments to solve the above problems and provide a diagnosis system and diagnosis method for a lithium ion secondary battery such that a performance degradation factor of the module battery can be classified into a usage environment factor and a manufacturing process factor (manufacturing factor) for diagnosis.

Solution to Problem

In order to attain the object, a diagnosis system for a lithium ion secondary battery includes a manufacturing quality information collection processing unit which collects manufacturing quality information from manufacturing processes of a single battery and module battery using the single battery of a lithium ion secondary battery; a manufacturing quality management database which stores the manufacturing quality information collected by the manufacturing quality information collection processing unit; an operation result information collection processing unit which collects operation result information from the module battery in operation under a usage environment; an operation result database which stores the operation result information collected by the operation result information collection processing unit; an operation result monitoring processing unit which monitors an operation condition of the module battery by using the operation result information; a manufacturing/usage environment factor classification processing unit which determines, based on the manufacturing quality information in the manufacturing quality management database and the operation result information in the operation result database, whether an abnormality factor of an operation result detected by the operation result monitoring processing unit is caused by a usage environment factor or a manufacturing factor; and a diagnosis result creation processing unit which creates a diagnosis result of the module battery to be diagnosed based on a processing result of the operation result monitoring processing unit and a processing result of the manufacturing/usage environment factor classification processing unit.

Further, in the diagnosis system for a lithium ion secondary battery, the operation result information collection processing unit collects the operation result information of the module battery after a charging completion of the module battery; and when the operation result monitoring processing unit detects, based on the operation result information collected by the operation result information collection processing unit, that abnormality of operation results is present, the manufacturing/usage environment factor classification processing unit determines whether an abnormality factor of the operation result is caused by the usage environment factor or the manufacturing factor.

Further, in the diagnosis system for a lithium ion secondary battery, the manufacturing quality information collection processing unit and the manufacturing quality management database are provided in a battery manufacturing management system having a manufacturing process for manufacturing the module; the operation result information collection processing unit is provided in a charging system which charges the module battery, and the operation result database, the operation result monitoring processing unit, the manufacturing/usage environment factor classification processing unit, and the diagnosis result creation processing unit configure a battery diagnosis system; and the battery manufacturing management system, the charging system, and the battery diagnosis system are connected via a network.

In order to attain the object, a diagnosis method for a lithium ion secondary battery includes a first step of collecting operation result information of a module battery of a lithium ion secondary battery in operation by using an operation result information collection unit; a second step of determining, based on an operation result monitoring unit, whether abnormality is present in the operation result information of the acquired module battery; a third step of acquiring manufacturing quality information of the module battery in which the abnormality is present in the operation result information and the manufacturing quality information of single batteries thereof by using a manufacturing/usage environment factor classification unit and determining, based on comparison processing of product inspection information of the manufacturing quality information, whether a significant difference of a manufacturing factor is present; and a fourth step of creating a diagnosis result of the module battery based on processing results of the operation result monitoring unit and the manufacturing/usage environment factor classification unit, and wherein a series of processing including the first to fourth steps is performed.

Advantageous Effects of Invention

According to the present invention, in a diagnosis of a module battery of a lithium ion secondary battery, a function of performing diagnosis processing for classifying a performance degradation factor of the module battery into a usage environment factor and a manufacturing process factor is included according to operation result information under a usage environment and quality management information of a manufacturing process of the individual module battery. Therefore, performance degradation measures can be taken in the manufacturing process, and reliability of the module battery can be improved. Based on an instruction of the diagnosis processing to a module battery and single battery having a manufacturing history as a manufacturing factor, the presence or absence of an abnormality can be grasped before a state in which a failure occurs and reliability of the lithium ion secondary battery can be secured.

Other objects, features and advantages of the invention will become apparent from the following description of the embodiments of the invention taken in conjunction with the accompanying drawings.

BRIEF DESCRIPTION OF DRAWINGS

FIG. 8 illustrates one specific example of manufacturing history information of a single battery based on information obtained from processes 1a and 1b of FIG. 1, FIG. 9 illustrates one specific example of manufacturing inspection information based on information obtained from a single battery inspection process 1d of FIG. 1;

FIG. 10 illustrates one specific example of manufacturing history information based on information obtained from a module battery assembling process 1e of FIG. 1;

FIG. 11 illustrates one specific example of product inspection information based on information obtained from a module battery inspection process 1f of FIG. 1;

FIG. 12 illustrates one specific example of operation result information based on operation data obtained from a module battery under a usage environment;

FIG. 13 illustrates one specific example of operation result information of a single battery unit of a module battery based on operation data obtained from a module battery under a usage environment;

FIG. 18 illustrates one specific example of an output result of a manufacturing history list of a module battery as an object of a determination of the presence or absence of an abnormality created at step S401 of FIG. 17;

FIG. 21 illustrates one specific example of an output screen of a diagnosis result in which a significant difference of a manufacturing factor obtained at step S507 of FIG. 20 is determined;

FIG. 22 illustrates one specific example of a diagnosis result of a module battery 2 to be diagnosed in which a screen created by a diagnosis result creation processing unit 10 of FIG. 1 is displayed;

DESCRIPTION OF EMBODIMENTS

Embodiments of the present invention will be described below with reference to the accompanying drawings.

Figure 1:
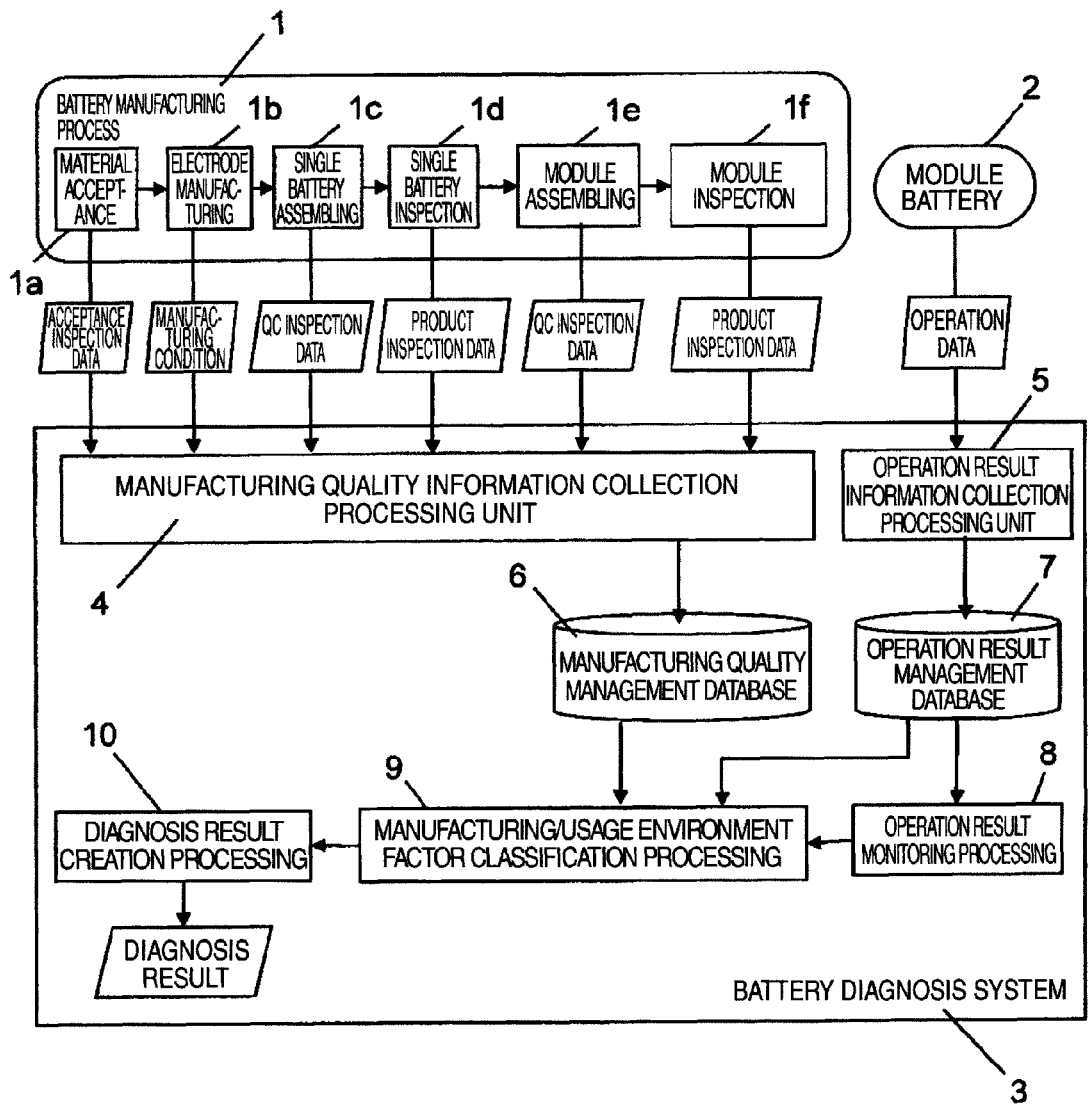
FIG. 1 is a block diagram illustrating a first embodiment of a diagnosis system and diagnosis method for a lithium ion secondary battery of the present invention.

FIG. 1 is a block diagram illustrating a first embodiment of a diagnosis system and diagnosis method of lithium ion secondary battery of the present invention. A reference numeral 1 denotes a manufacturing process, a reference numeral 1a denotes a material acceptance process, a reference numeral 1b denotes an electrode manufacturing process, a reference numeral 1c denotes a single battery assembling process, a reference numeral 1d denotes a single battery inspection process, a reference numeral 1e denotes a module assembling process, a reference numeral 1f denotes a module inspection process, a reference numeral 2 denotes a module battery in service (under a usage environment), a reference numeral 3 denotes a battery diagnosis system, a reference numeral 4 denotes a manufacturing quality information collection processing unit, a reference numeral 5 denotes an operation result information collection processing unit, a reference numeral 6 denotes a manufacturing quality management database, a reference numeral 7 denotes an operation result management database, a reference numeral 8 denotes an operation result monitoring processing unit, a reference numeral 9 denotes a manufacturing/usage environment factor classification processing unit, and a reference numeral 10 denotes a diagnosis result creation processing unit.

In FIG. 1, the battery diagnosis system 3 includes the manufacturing quality information collection processing unit 4 which collects and processes various data obtained in a manufacturing process of a single battery and the manufacturing process of a module battery from the manufacturing process 1, and creates manufacturing quality information of the module battery and the manufacturing quality information of the single battery thereof; the manufacturing quality management database 6 which stores and holds the manufacturing quality information created by the manufacturing quality information collection processing unit 4; the operation result information collection processing unit 5 which collects and processes the operation result information from the module battery 2 in operation under a usage environment during the charging; the operation result management database 7 which stores and holds the operation result information collected and processed by the operation result information collection processing unit 5; the operation result monitoring processing unit 8 which monitors an operation condition of the module battery 2 by using the operation result information collected and processed by the operation result information collection processing unit 5; the manufacturing/usage environment factor classification processing unit 9 diagnoses, based on a monitoring result of the operation result monitoring processing unit 8, whether the abnormality factor of the operation result is caused by a usage environment factor or a manufacturing factor, by using the manufacturing quality information in the manufacturing quality management database 6 and the operation result information in the operation result management database 7; and the diagnosis result creation processing unit 10 which creates the diagnosis result of the module battery 2 to be diagnosed based on the processing result of the operation result monitoring processing unit 8 and the processing result of the manufacturing/usage environment factor classification processing unit 9.

Figure 2:
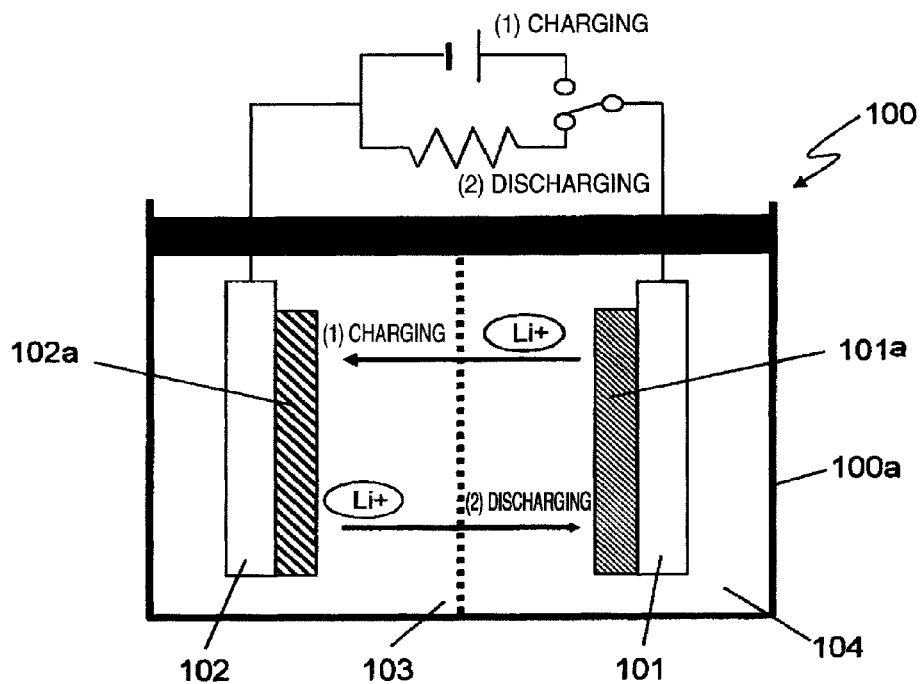
FIG. 2 schematically illustrates a conventional operation principle of a lithium ion secondary battery.
Figure 3:
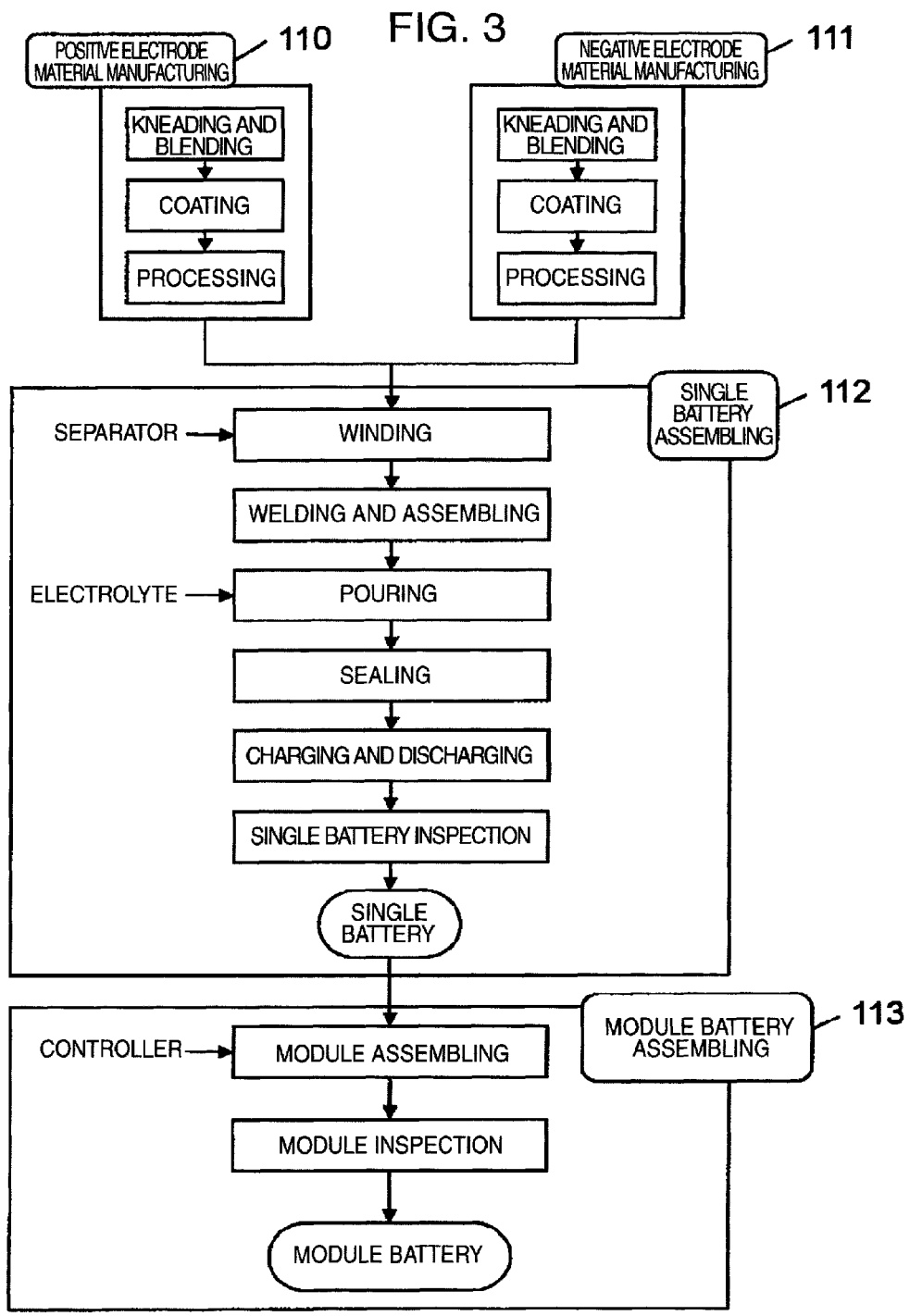
FIG. 3 schematically illustrates a conventional manufacturing process of a single battery and module battery of a lithium ion secondary battery.
Figure 4:
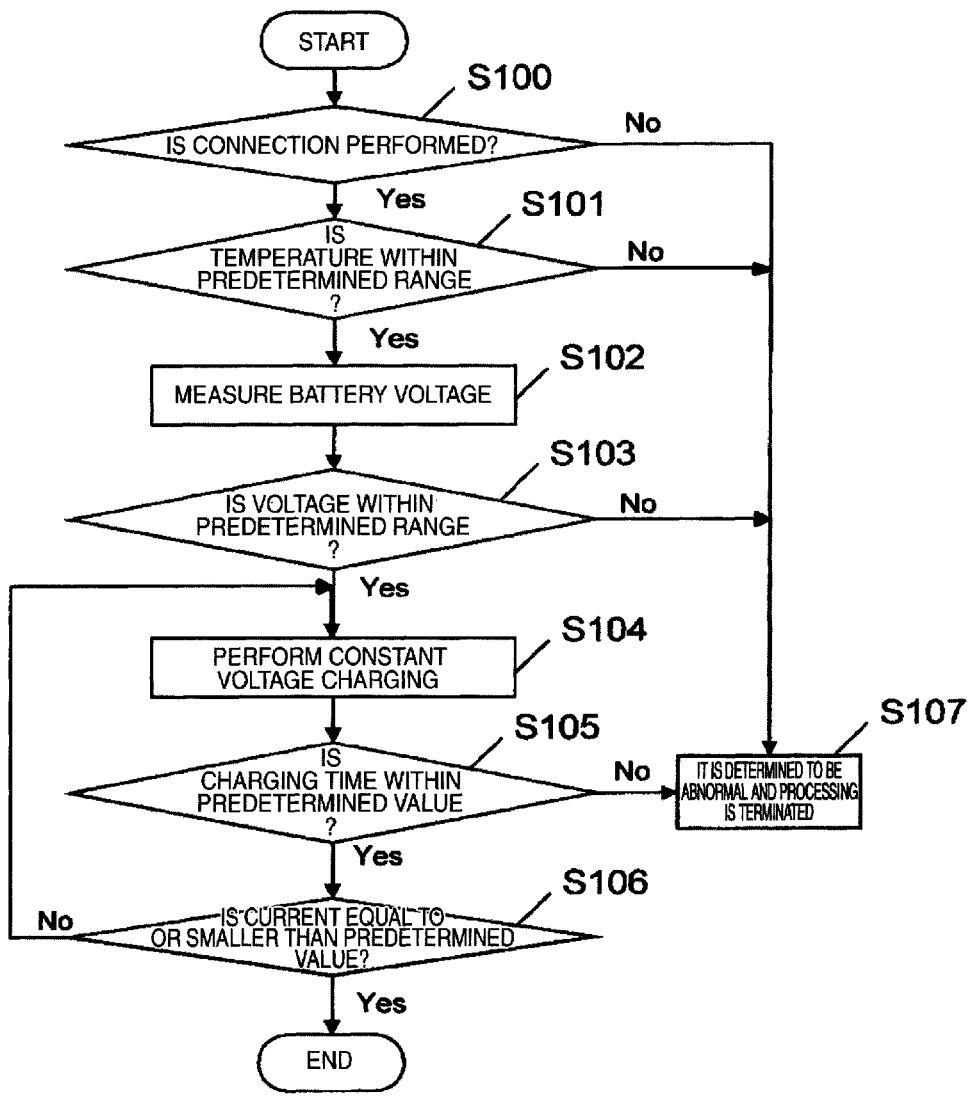
FIG. 4 is a flowchart illustrating a conventional procedure of a method for charging a lithium ion secondary battery.

The battery manufacturing process 1 corresponds to a battery manufacturing process illustrated in FIG. 3. The material acceptance process 1a is a process for accepting materials of a positive electrode 101 and negative electrode 102 of a single battery of FIG. 2, and corresponds to a positive electrode material manufacturing process 110 and negative electrode material manufacturing process 111 of FIG. 3. The electrode manufacturing process 1b corresponds to winding and welding/assembling processes of the single battery assembling process 112 of FIG. 3 for manufacturing the positive electrode 101 and the negative electrode 102 with the accepted materials. The single battery assembling process 1c corresponds to pouring and sealing processes of the single battery assembling process 112 of FIG. 3. In the same manner, the single battery inspection process 1d corresponds to charging/discharging to single battery inspection processes of the single battery assembling process 112 of FIG. 3. The module assembling process 1e corresponds to a module assembling process of the module battery assembling process 113 of FIG. 3. In the same manner, the module inspection process 1f corresponds to a module inspection process of the module battery assembling process 113 of FIG. 3.

Figure 6A:
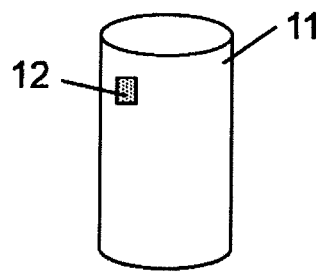
FIG. 6A illustrates a type of a single battery of a lithium ion secondary battery manufactured in a single battery process 1*c* of a battery manufacturing process 1 of FIG. 1.
Figure 6B:
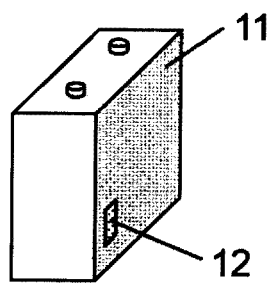
FIG. 6B illustrates a type of a single battery of a lithium ion secondary battery manufactured in a single battery process 1*c* of a battery manufacturing process 1 of FIG. 1.
Figure 6C:
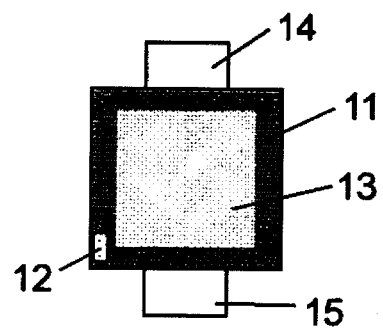
FIG. 6C illustrates a type of a single battery of a lithium ion secondary battery manufactured in a single battery process 1*c* of a battery manufacturing process 1 of FIG. 1.

FIGS. 6A to 6C illustrate a type of a single battery of the lithium ion secondary battery manufactured in the single battery process 1c of the battery manufacturing process 1 of FIG. 1. A reference numeral 11 denotes a single battery, a reference numeral 12 denotes a control number mark, a reference numeral 13 denotes a laminaire, a reference numeral 14 denotes a positive electrode, and a reference numeral 15 denotes a negative electrode.

FIG. 6A illustrates the cylindrical single battery 11, and the single battery 11 has a configuration illustrated in FIG. 2 and an electrode can 100a thereof is cylindrical. To a surface of the single battery 11, for example, a readable control number mark 12 having bar-codes for controlling the single battery 11 is attached. In each manufactured single battery 11, the manufacturing quality information collection processing unit 4 (FIG. 1) associates a control number of the single battery 11 read from the control number mark 12 and manufacturing quality information of the single battery 11 with each other and collects it from the battery manufacturing process 1 (FIG. 1).

FIG. 6B illustrates the rectangular single battery 11, and the single battery 11 has a configuration illustrated in FIG. 2 and an electrode can 100a thereof is rectangular. To a surface of the single battery 11, for example, a readable control number mark 12 having bar-codes for controlling the single battery 11 is attached. In each manufactured single battery 11, the manufacturing quality information collection processing unit 4 (FIG. 1) creates the manufacturing quality information based on data collected from the battery manufacturing process 1. The manufacturing quality information collection processing unit 4 further associates the control number of the single battery 11 read from the control number mark 12 of the single battery 11 and the manufacturing quality information of the single battery 11 with each other.

FIG. 6C illustrates the laminated single battery 11, and the single battery 11 has a configuration of FIG. 2 in which a main body is tightly sealed in the laminaire 13, and the positive electrode 14 and the negative electrode 15 are partially protruded from this laminaire 13 to the outside. To a surface of this laminaire 13, for example, a readable control number mark 12 having bar-codes for controlling the single battery 11 is attached. In each manufactured single battery 11, the manufacturing quality information collection processing unit 4 (FIG. 1) creates the manufacturing quality information based on data collected from the battery manufacturing process 1. The manufacturing quality information collection processing unit 4 further associates the control number of the single battery 11 read from the control number mark 12 of the single battery 11 and the manufacturing quality information of the single battery 11 with each other.

Figure 7:
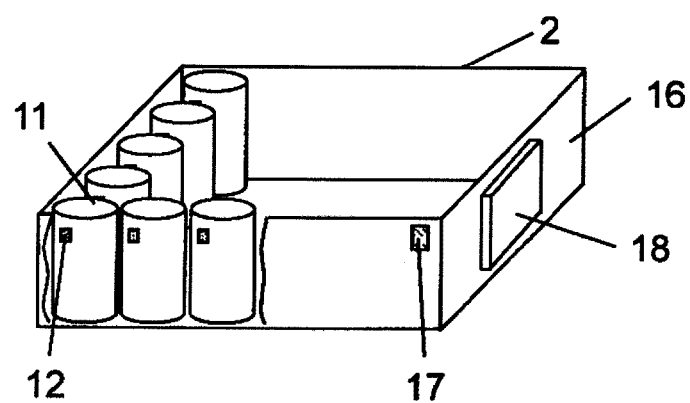
FIG. 7 is a perspective view schematically illustrating a configuration of a module battery of a lithium ion secondary battery manufactured in a module assembling process 1e of a battery manufacturing process 1 of FIG. 1.

FIG. 7 is a perspective view schematically illustrating a configuration of the module battery 2 of the lithium ion secondary battery manufactured in the module assembling process 1e of the battery manufacturing process 1 of FIG. 1. A reference numeral 16 denotes a battery can, a reference numeral 17 denotes a control number mark, and a reference numeral 18 denotes a controller, and the same circuit elements as those of FIGS. 6A to 6C are indicated by the same reference numerals as those of FIGS. 6A to 6C.

In FIG. 7, the module battery 2 has a configuration in which a plurality of the single batteries 11 are arranged within the battery can 16 and these single batteries are connected in series between a positive electrode and negative electrode (not illustrated) of this module battery 2. To a surface of the battery can 16 of the module battery 2, for example, a readable control number mark 17 having bar-codes for controlling this module battery 2 is attached. On a surface of the battery can 16, a controller 18 for controlling results of this module battery 2 under a usage environment is further provided. These control number mark 17 and controller 18 are attached on an appropriate portion of the surface of the battery can 16. In each assembled module battery 2, the manufacturing quality information collection processing unit 4 (FIG. 1) creates the manufacturing quality information and associates a control number of the module battery 2 read from the control number mark 17 of the module battery 2 and the manufacturing quality information of the module battery 2 with each other.

The controller 18 has a counter which counts the cumulative number of times of charge/discharge cycles to be hereinafter described, a timer which measures the elapsed time from the shipping of the module battery 2, and a unit which acquires information relating to the single battery 11 and charging/discharging information. The controller 18 further has a normal operation model which represents data at the time when this module battery 2 normally operates, and provides the above data as operation data to the operation result information collection processing unit 5 during the charging.

In FIG. 1, with the control numbers of the module battery and the single batteries thereof, the manufacturing quality information collection processing unit 4 associates various types of information relating to manufacturing of the module battery 2 and the single batteries 11 thereof, namely, acceptance inspection data relating to materials of positive electrodes and negative electrodes in the material acceptance process 1a, data of manufacturing conditions relating to the manufacturing of positive electrodes and negative electrodes in the electrode manufacturing process 1b, QC (Quality Check) inspection data obtained during the single battery assembling in the single battery assembling process 1c, product inspection data obtained by the inspection of the single battery manufactured in the single battery inspection process 1d, QC inspection data obtained at the time of assembling the module battery in the module assembling process 1e, and product inspection data obtained by the inspection of the module battery manufactured in the module inspection process 1f and collects the above data from the manufacturing process 1 of the lithium ion secondary battery. The manufacturing quality information collection processing unit 4 creates the manufacturing quality information of the single battery 11 and the module battery 2 from the above data, and stores it in the manufacturing quality management database 6. Examples of the manufacturing quality information include manufacturing history information (information of the manufacturing order of the single battery 11 and the usage order of its materials) in the material acceptance process 1a to the single battery assembling process 1c, product inspection information in the single battery inspection process 1d, manufacturing history information (information of the manufacturing order of the module battery 2 and the usage order of the single battery 11) in the module assembling process 1e, and product inspection information in the module inspection process 1f.

The manufacturing history information of the single battery assembling is collected for each control number of the single battery 11. Examples of the manufacturing history information of this single battery assembling include a name (or a code) and control number (e.g., a lot number) of each type of material of electrodes used for assembling the single battery 11, a name (or a code) of the product and process in which processing is performed, processing date and time, a name (or a code) of a manufacturing device, and a recipe name (an operation program name of the manufacturing device used in the product and process).

The manufacturing history information of the module battery 2 is collected corresponding to the control number of the module battery 2. Examples of the manufacturing history information of this module battery 2 include assembling date and time, a control number of the used single battery 11, and control numbers of components such as the controller 18.

Figure 5A:
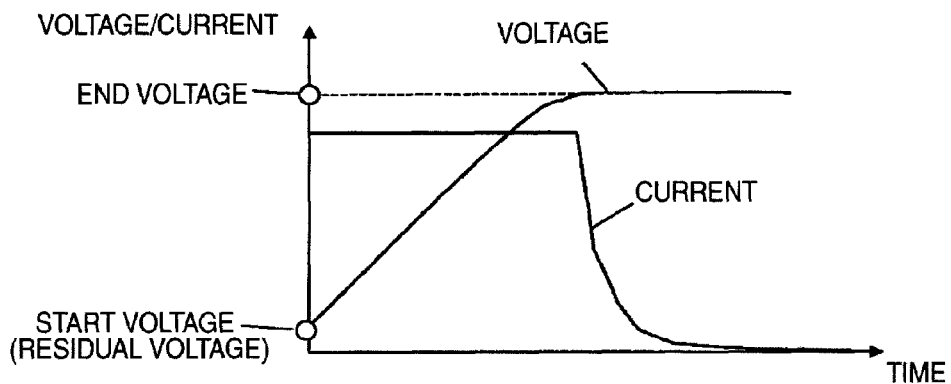
FIG. 5A schematically illustrates a transition of a voltage and current during conventional charging processing of a lithium ion secondary battery.
Figure 5B:
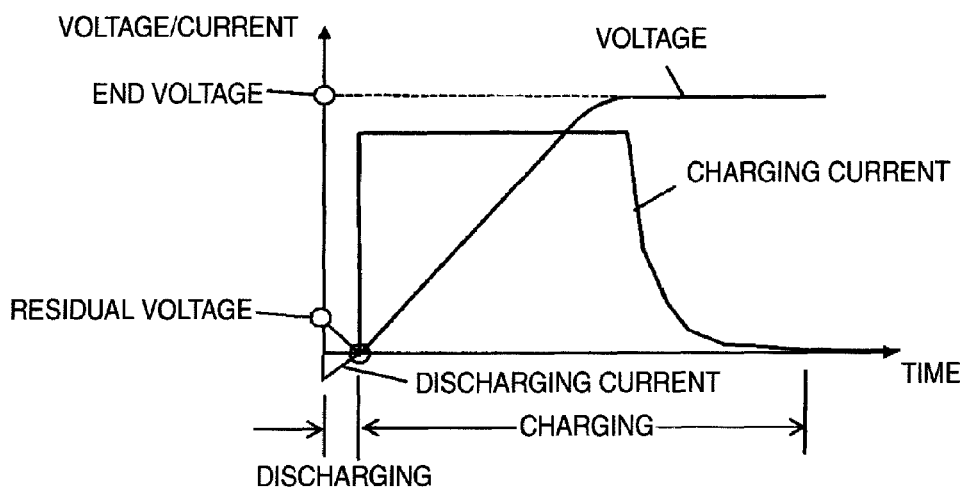
FIG. 5B schematically illustrates a transition of a voltage and current during conventional charging processing of a lithium ion secondary battery.

Examples of the product inspection information of the single battery 11 include analog data of current and voltage at the time of the charging/discharging of this single battery 11 (this "discharging" is discharging of residual voltage of the single battery 11 through a charging device as illustrated in FIG. 5B, and so forth) in addition to a control number, inspection date and time, and performance data such as capacitance and voltage of the single battery 11. Further, examples of the product inspection information of the module battery 2 include analog data of current and voltage at the time of the charging/discharging of this module battery 2 (this "discharging" is discharging of residual voltage of the module battery 2 through a charging device as illustrated in FIG. 5B, and so forth) in addition to a control number, inspection date and time, and performance data such as capacitance and voltage of the module battery 2.

Along with the control number obtained from the control number mark 17 provided on this module battery 2, the operation result information collection processing unit 5 acquires the operation result information such as operation data during the operation of the module battery 2 under a usage environment from the controller 18 (FIG. 7) provided on the module battery 2, and stores it in the operation result information management database 7. Examples of the operation result information of the module battery 2 include the cumulative number of times of charge/discharge cycles being the cumulative number of times of charging from the shipping to the present of this module battery 2, the elapsed time being a time from the shipping to the present of this module battery 2, and analog data of current and voltage at the time of the charging and discharging as illustrated in FIGS. 5A and 5B in addition to the performance data such as capacitance and voltage of the battery corresponding thereto. Such operation result information of the module battery 2 is obtained by the controller 18 of the module battery 2 and stored therein. In the controller 18, a setting value for the above-described performance data at the time when this module battery 2 normally operates is set as the normal operation model.

When subjecting this module battery 2 to charging processing by using a charging system connected to a network, the operation result information collection processing unit 5 can acquire the operation result information along with the normal operation model from the controller 18 of this module battery 2 via the network. In the case where this module battery 2 is mounted on an equipment system having a communication function for use, the operation result information collection processing unit 5 can acquire the operation result information of this module battery 2 along with the normal operation model from the controller 18 by using the communication function of the equipment system. When the module battery 2 is mounted for inspection on the equipment system which regularly performs an inspection, the operation result information collection processing unit 5 can acquire the operation result information in the controller 18 of this module battery 2 along with the normal operation model by using a special data collecting device.

When the operation result information collection processing unit 5 freshly acquires the operation result information from the module battery 2 and stores it in the operation result management database 7, the operation result monitoring processing unit 8 acquires the operation result information and normal operation model of this module battery 2 from the operation result management database 7 and determines, based on the operation result information and the normal operation model, whether abnormality of the operation result of this module battery 2 is present.

If the operation result monitoring processing unit 8 determines that the abnormality of the operation result of the module battery 2 is present, the manufacturing/usage environment factor classification processing unit 9 acquires the manufacturing quality information from the manufacturing quality management database 6, and determines, based on this manufacturing quality information, whether a manufacturing factor is present. The diagnosis result creation processing unit 10 creates a diagnosis result of the module battery 2 to be diagnosed based on a processing result of the operation result monitoring processing unit 8 and the manufacturing/usage environment factor classification processing unit 9.

In the manufacturing quality management database 6, a product name corresponding to the control number of the single battery 11, a process name (or a code), a processing date and time, a name of the manufacturing device (or a code), a recipe name (an operation program name of the manufacturing device used in the product and process), a name (or a code) and control number (e.g., a lot number) for each material type, product inspection information of the single battery 11 (performance data such as capacitance and voltage), a control number of the single battery 11 corresponding to the control number of the module battery 2, a control number of a component such as the controller, and product inspection information of the module battery 2 (performance data such as capacitance and voltage) are registered.

In the operation result management database 7, the cumulative number of times of charge/discharge cycles, cumulative elapsed time, performance data such as capacitance and voltage, and normal operation model corresponding to the control number of the module battery 2 and the single battery 11 are registered.

FIG. 8 illustrates one specific example of the manufacturing history information of the single battery 11 based on the information obtained from the processes 1a and 1b of FIG. 1, and a reference numeral 20 denotes the manufacturing history information of the single battery 11.

A winding process for winding the positive electrode, the negative electrode, and the separator in piles in FIG. 3 is performed in the manufacturing of the single battery 11. To the single battery 11 in which the winding process is performed, a serial number corresponding to the order is set in the order corresponding to this winding process. Along with information of the positive electrode, negative electrode, and separator of this single battery 11, the manufacturing quality information collection processing unit 4 of FIG. 1 acquires, from the material acceptance process 1a and the electrode manufacturing process 1b, the serial number 20a set to the single battery 11 which receives the winding process. The manufacturing quality information collection processing unit 4 processes it to create the manufacturing history information 20 illustrated in FIG. 8, and stores it in the manufacturing quality management database 6.

In the manufacturing history information 20 of the single battery 11, the serial numbers 20a of the acquired single battery 11 are arranged in the acquisition order as illustrated in FIG. 8. In each serial number 20a (namely, in each single battery 11), the manufacturing history information 20 includes the negative information 20d having date and time at which winding is performed 20b, positive electrode information 20c having control numbers of positive electrode materials and control numbers of various materials (blending materials 1, 2, . . . ) used for blending positive electrode materials, and negative electrode information 20d having control numbers of negative electrode materials and control numbers of various materials (blending materials 1, 2, . . . ) used for blending negative electrode materials, and a control number of the separator 20e.

The positive electrode materials and negative electrode materials are manufactured from film-like metallic foils. A plurality of positive electrodes and negative electrodes are created from one positive electrode material and negative electrode material, respectively, and used for manufacturing a plurality of single batteries. Accordingly, the single battery 11 having the positive electrode and negative electrode created from the same positive electrode material and negative electrode material has the same serial number of those of the positive electrode material, the negative electrode material, and the blending material. According to the manufacturing history information 20 illustrated in FIG. 8, the single batteries 11 of the serial numbers B01 and B02 have the same positive electrode information 20c, negative electrode information 20d, and separator 20e. However, a separator different from those of the single batteries 11 of the serial numbers B01 and B02 is used in the single battery of the serial number B03. In the single batteries 11 of the serial numbers B04 to B06, the blending material 1 of the positive electrode information 20c is used in the same manner as in the single batteries 11 of the serial numbers B01 to B03. In the single batteries 11 of the serial numbers B04 to B06, blending materials of the positive electrode information 20c and negative electrode information 20d other than the above positive electrode information 20c are different from those of the single batteries 11 of the serial numbers B01 to B03.

FIG. 9 illustrates one specific example of the manufacturing inspection information based on the information obtained from the single battery inspection process 1d of FIG. 1, and a reference numeral 21 denotes the manufacturing inspection information of the single battery 11.

In FIG. 9, in the manufacturing inspection information 21 of the single battery 11, the serial numbers 20a of the acquired single battery 11 are arranged in the acquisition order (namely, inspection order). The manufacturing inspection information 21 includes an inspection date and time 21a, and an inspection item 21b for each serial number 20a (namely, for each single battery 11). As the inspection item 21b, the manufacturing inspection information 21 includes voltage, current, and capacitance obtained at the time of the inspection of the single battery 11.

FIG. 10 illustrates one specific example of the manufacturing history information based on the information obtained from the module battery assembling process 1e, and a reference numeral 22 denotes the manufacturing history information of the module battery 2.

In the module assembling process 1e of FIG. 1, the module battery 2 is assembled by using a plurality of the single batteries 11. To this assembled module battery 2, the serial number (module serial number) corresponding to the order is set in the order corresponding to the assembling. Along with the information relating to this module battery 2, the manufacturing quality information collection processing unit 4 of FIG. 1 acquires the module serial number 22a set in the assembled module battery 2 from the module assembling process 1e. The manufacturing quality information collection processing unit 4 then processes the module serial number 22a to create the manufacturing history information 22 of the module battery 2 illustrated in FIG. 10, and stores it in the manufacturing quality management database 6.

As illustrated in FIG. 8, in the manufacturing history information 22 of this module battery 2, the serial numbers 22a of the acquired module battery 2 are arranged in the acquisition order. For each serial number 22a (namely, for each module battery 2), the manufacturing history information 22 includes an assembling date and time 22b of the module battery 2, a control number 22c of the single battery 11 used in this module battery 2, and a serial number of the controller 18 (FIG. 7) attached to this module battery 2.

FIG. 11 illustrates one specific example of the product inspection information based on the information obtained from the module battery inspection process 1f, and a reference numeral 23 denotes the product inspection information of the module battery 2.

In FIG. 11, in the product inspection information 23, the serial numbers 22a of the acquired module battery 2 are arranged in the acquisition order (namely, inspection order). The product inspection information 23 includes an inspection date and time 23a, and an inspection item 23b for each serial number 22a (namely, for each module battery 2). As the inspection item 23b, the product inspection information 23 includes voltage, current, and capacitance of the module battery 2.

FIG. 12 illustrates one specific example of operation result information based on the operation data obtained from the module battery 2 under a usage environment, and a reference numeral 24 denotes the operation result information.

In FIG. 12, in the module battery 2 under a usage environment after the shipping, for example, the operation result information collection processing unit 5 (FIG. 1) takes in the operation data from the controller 18 (FIG. 7) during the charging. The operation result information collection processing unit 5 processes the operation data to create the operation result information 24 illustrated in FIG. 12, stores it in the operation result management database 7 (FIG. 1), and supplies it to the operation result monitoring processing unit 8.

In this operation result information 24, the serial numbers 22a of the module battery 2 are arranged in the order in which the operation data is acquired. For each serial number 22a (namely, for each module battery 2), the operation result information 24 includes a date and time at which charging is performed 24a, cumulative number of times of charge cycles 24b, elapsed time 24c after shipping, and performance data such as voltage, current, and capacitance of the module battery 2 during the charging processing. The cumulative number of times of charge cycles for each control number of the module battery 2 is not necessarily sequential data.

FIG. 13 illustrates one specific example of operation result information of a single battery unit of the module battery 2 based on the operation data obtained from the module battery 2 under a usage environment, and a reference numeral 25 denotes the operation result information.

In FIG. 13, in each module battery 2, the operation result information 25 includes a date and time at which charging is performed for each control number 20a of the single battery, a cumulative number of times of charge cycles, an elapsed time after shipping (these are the same as each other in the same module battery 2), and performance data such as voltage, current, and capacitance of the single battery 11 during the charging processing in each control number 20*a* of the single battery 11.

Figure 14:
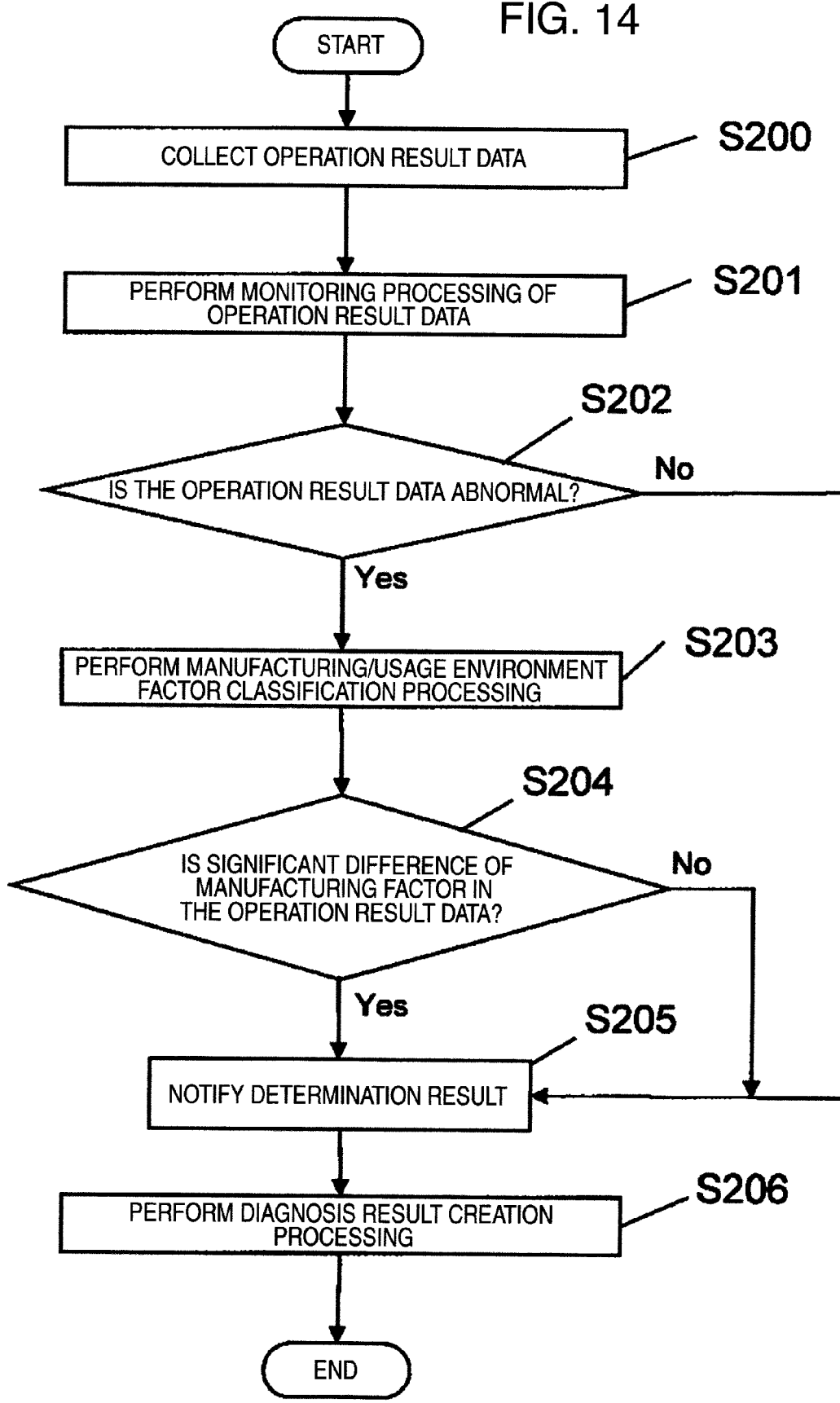
FIG. 14 is a flowchart illustrating one specific example of a diagnosis processing flow of a module battery of a lithium ion secondary battery under a usage environment through a battery diagnosis system of FIG. 1.

FIG. 14 is a flowchart illustrating one specific example of a diagnosis processing flow of the module battery 2 of the lithium ion secondary battery under a usage environment through the battery diagnosis system 3 of FIG. 1.

In FIG. 14, during the charging of the module battery 2, the operation result information collection processing unit 5 (FIG. 1) collects the operation data and the normal operation model from the module battery 2, and processes this operation data to create the operation result information 24 illustrated in FIG. 12 (note that the operation result information 25 illustrated in FIG. 13 may be created, however, the operation result information 24 illustrated in FIG. 12 will be described below). The operation result information collection processing unit 5 stores the operation result information 24 and the normal operation model in the operation result management database 7 (FIG. 1) and supplies them to the operation result monitoring processing unit 8. Through the process, the operation result monitoring processing unit 8 acquires the operation result information 24 and normal operation model of the charged module battery 2 (step S200).

The operation result monitoring processing unit 8 performs comparison processing of the acquired operation result information 24 and normal operation model (step S201), and determines whether abnormality is present in the operation result of the module battery 2 (step S202). This abnormality determination method will be described later with reference to FIG. 15. If the abnormality is not present in the operation result of the module battery 2 ("No" at step S202), the operation result monitoring processing unit 8 supplies the determination result to the manufacturing/usage environment factor classification processing unit 9 (FIG. 1). The manufacturing/usage environment factor classification processing unit 9 notifies the diagnosis result creation processing unit 10 (FIG. 1) of the determination result (step S205), and the diagnosis result creation processing unit 10 creates diagnosis results based on this determination result (step S206).

Also if determining that the abnormality is present in the operation result of the module battery 2 ("Yes" at step S202), the operation result monitoring processing unit 8 supplies the determination result to the manufacturing/usage environment factor classification processing unit 9. The manufacturing/usage environment factor classification processing unit 9 acquires the manufacturing quality information (namely, the manufacturing history information 20 (FIG. 8) and manufacturing inspection information 21 (FIG. 9) of the single battery 11 used in the module battery 2, the manufacturing history information 22 (FIG. 10) and manufacturing inspection information 23 (FIG. 11) of the module battery 2) corresponding to the module battery 2 from the manufacturing quality management database 6. The manufacturing/usage environment factor classification processing unit 9 starts performance of the manufacturing/usage environment factor classification processing for determining based on this manufacturing quality information whether the module battery 2 has an abnormality manufacturing factor (step S203). As a factor that the abnormality is present in the operation result information of the module battery 2, the manufacturing/usage environment factor classification processing unit 9 determines whether a significant difference of the manufacturing factor is present (step S204). If the significant difference of the manufacturing factor is present ("Yes" at step S204), or also if the significant difference of the manufacturing factor is not present ("No" at step S204), the manufacturing/usage environment factor classification processing unit 9 supplies the determination result information to the diagnosis result creation processing unit 10 (FIG. 1) (step S205). The diagnosis result creation processing unit 10 creates diagnosis results based on this determination result (step S206).

Figure 15:
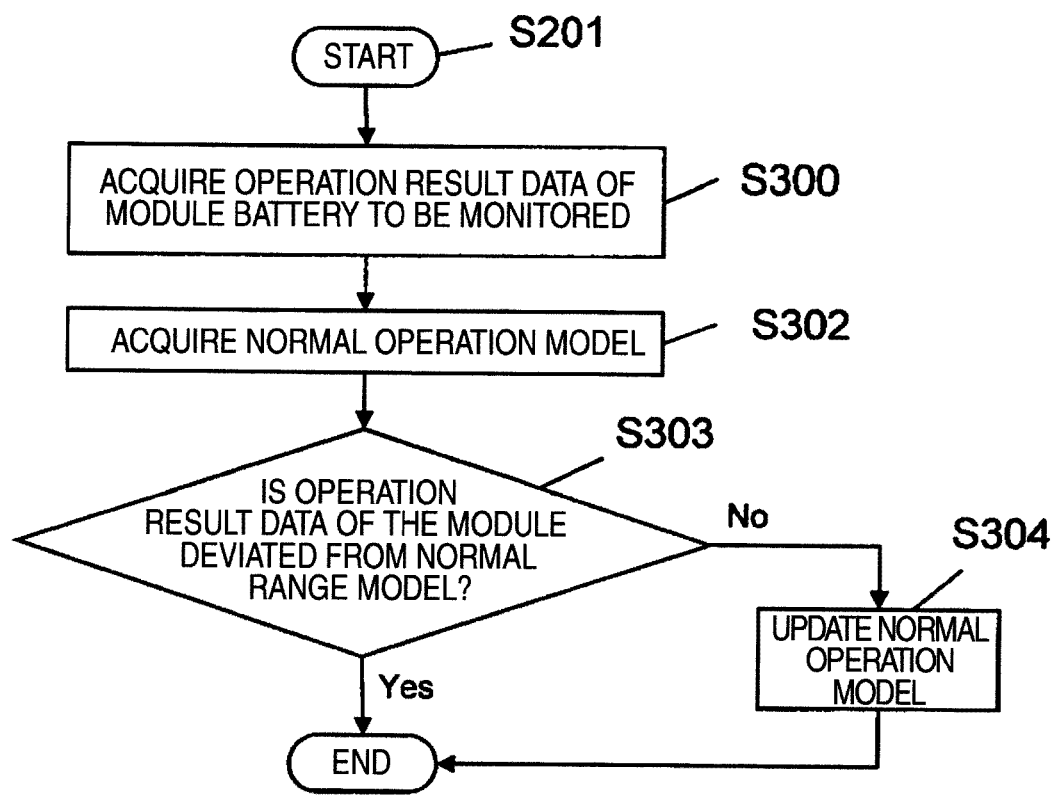
FIG. 15 is a flowchart illustrating one specific example of processing at step S201 of FIG. 14 performed by an operation result monitoring processing unit 8 of FIG. 1.

FIG. 15 is a flowchart illustrating one specific example of processing of step S201 of FIG. 14 performed by the operation result monitoring processing unit 8 of FIG. 1. Here, the description will be made assuming that the operation result information of the module battery 2 is the operation result information 24 illustrated in FIG. 12.

In FIG. 15, the operation result monitoring processing unit 8 acquires the operation result information 24 of the module battery 2 to be diagnosed due to the charging at step S201. The operation result monitoring processing unit 8 then extrudes the cumulative number of times of charge cycles 24*b* and elapsed time 24*c* of the module battery 2, and performance data such as the measurement item 24*d* of the module battery 2 from the operation result information. The performance data of the module battery 2 is herein a module unit, and in the case of the operation result information 25 illustrated in FIG. 13, it is a single battery unit of the module battery 2 (step S300).

Next, the operation result monitoring processing unit 8 acquires the normal operation model representing a normal operation result of the module battery 2 (step S301). The normal operation model includes data such as an upper or lower limit threshold indicating a range of a performance data transition of the normal module battery 2 with respect to the cumulative number of times of charge cycles, and an upper or lower limit threshold indicating a range of a performance data transition of the normal module battery 2 with respect to the elapsed time. The normal operation model is set in each type of the performance data. Further, the upper or lower limit threshold of the battery performance data with respect to the cumulative number of times of charge cycles and the elapsed time is represented based on past result data by using a polynomial approximation formula. In the case of a tertiary approximation formula, as the tertiary approximation formula using as a variable t the cumulative number of times of charge cycles or the elapsed time, for example, the upper and lower limit thresholds to the measurement item i of the performance data as illustrated in FIGS. 12 and 13 are represented by the following formula 1 with four coefficients "a_uk(i)" and "a_lk(i)" (provided that k=0, 1, 2, and 3), respectively.

Upper limit threshold=$a\_u3(i)*t^3+a\_u2(i)*t^2+a\_u1(i)*t+a\_u0(i)$

Lower limit threshold=$a\_l3(i)*t^3+a\_l2(i)*t^2+a\_l1(i)*t+a\_l0(i)$ (Formula 1)

Based on the operation result information and normal operation model of the module battery 2, the operation result monitoring processing unit 8 determines whether the operation results of the respective measurement items i of the performance data of the module battery 2 are deviated from the normal operation model corresponding thereto (step S303). Even if one operation result is deviated from the normal operation model, the operation result monitoring processing unit 8 determines that the operation result is abnormal ("Yes" at step S303), and terminates the process. If no operation result is deviated from the normal operation model, the operation result monitoring processing unit 8 adds the respective operation results of this acquired module battery 2 to the respective corresponding normal operation models and updates the respective normal operation models (step S304).

In the normal operation model represented by the polynomial approximation formula as described above, respective coefficients of the polynomial approximation formula are updated through a least-square approximation using data to which operation results of the newly acquired module battery 2 are added.

Figure 16:
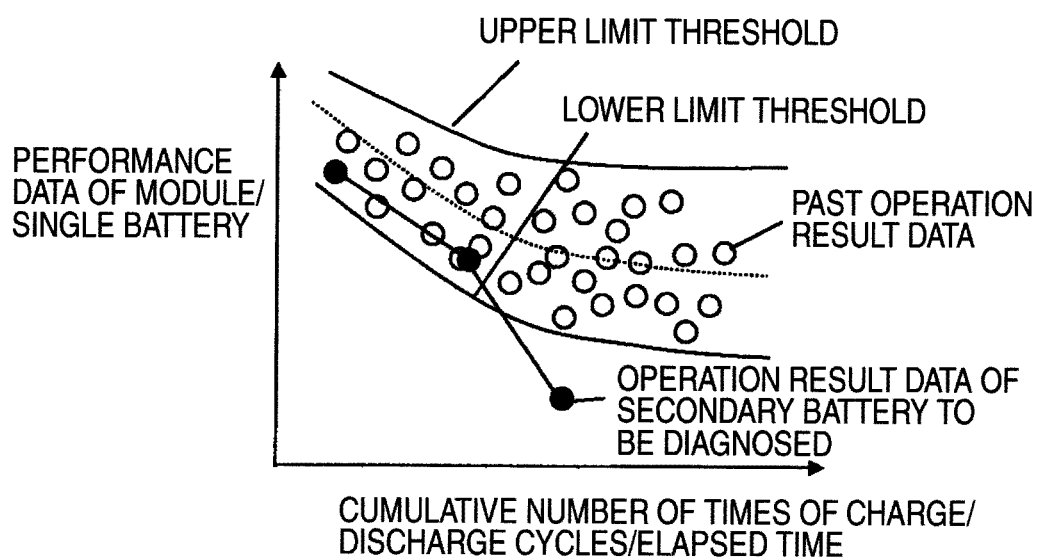
FIG. 16 illustrates an output screen representing an abnormality determination result of operation result information of a module battery in an operation result monitoring processing unit illustrated in FIG. 15.

FIG. 16 illustrates an output screen representing the abnormality determination result of the operation result information of the module battery 2 in the operation result monitoring processing illustrated in FIG. 15.

For each type of the performance data, the normal operation model calculated based on the past operation result information is represented by using the upper or lower limit threshold corresponding to the cumulative number of times of charge cycles or the elapsed time. As illustrated in FIG. 16, the operation result monitoring processing unit 8 plots the operation result data of the module battery 2 to be diagnosed. The operation result monitoring processing unit 8 determines whether a plotting point is included in the range of the upper or lower limit threshold of the normal operation model, and as a result, determines whether an abnormal operation result is present.

In FIG. 16, since the operation result data indicated by a black circle of the module battery 2 to be diagnosed is smaller than the lower limit threshold, it is determined that this operation result is abnormal. Note that the performance data of the module battery 2 may be any of the module unit and the single battery unit of the module battery 2.

Figure 17:
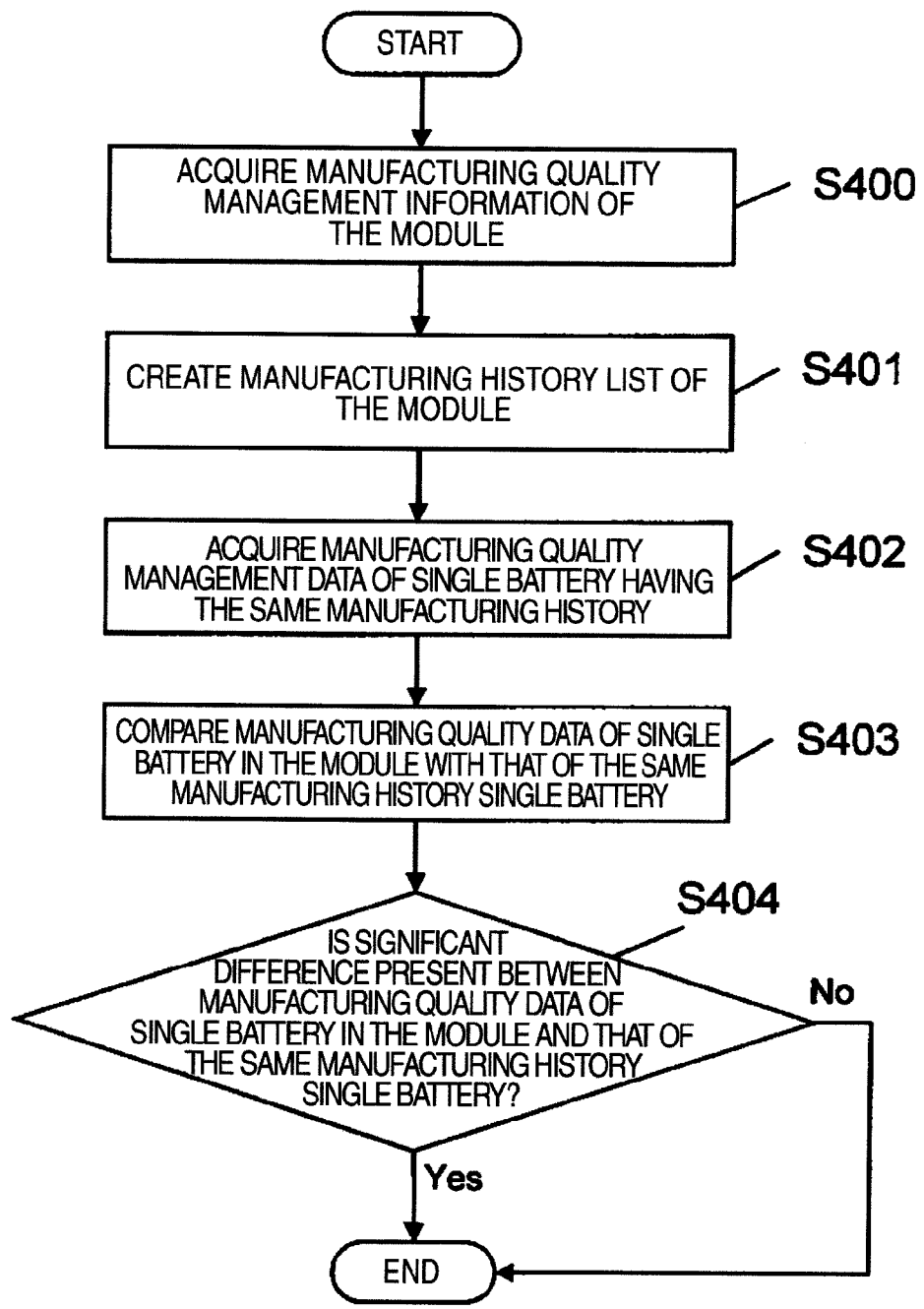
FIG. 17 is a flowchart illustrating one specific example of step S203 for manufacturing/usage environment factor classification processing of an operation abnormality of FIG. 14 through a manufacturing/usage environment factor classification processing unit of FIG. 1.

FIG. 17 is a flowchart illustrating one specific example of step S203 of the manufacturing/usage environment factor classification processing for the operation abnormality of FIG. 14 through the manufacturing/usage environment factor classification processing unit 9 of FIG. 1.

In FIG. 17, at step S301, with respect to the module battery 2 as an object of the factor classification processing, the manufacturing/usage environment factor classification processing unit 9 acquires the manufacturing quality management information corresponding thereto from the manufacturing quality management database 6 (FIG. 1) (step S400).

As the manufacturing quality management information of the module battery 2, not only the manufacturing history information and product inspection information of the module battery 2 but also the manufacturing history information and product inspection information of the single battery 11 mounted on the module battery 2 are included. As illustrated in FIG. 10, the manufacturing history information of the module battery 2 includes an assembling date and time, a control number of a used single battery, and a control number of a component such as a controller. As illustrated in FIG. 11, the product inspection information of the module battery 2 includes analog data of current and voltage during the charging and discharging in addition to the inspection date and time, and the performance data such as capacitance and voltage. The manufacturing history information of the module battery 2 includes a name of each material type of the used electrode material (or a code), a control number (e.g., a lot number), a name of the product and process in which processing is performed (or a code), processing date and time, a name of the manufacturing device (or a code), and a recipe name (an operation program name of the manufacturing device used in the product and process.

Further, the product inspection information of the single battery 11 includes analog data of current and voltage during the charging and discharging in addition to a control number, inspection date and time, and performance data such as capacitance and voltage of the single battery 11.

Next, based on the manufacturing quality management information of the acquired module battery 2, the manufacturing/usage environment factor classification processing unit 9 creates the manufacturing history list (step S401). The manufacturing history list includes names and the control numbers of various components and materials used in the assembling process of the module battery 2 and used in the assembling process of the single battery 11 mounted on the module battery 2.

FIG. 18 illustrates one specific example of an output result of the above-described manufacturing history list of the module battery 2 as an object of a determination of the presence or absence created at step S401, and a reference numeral 26 denotes a manufacturing history list.

In FIG. 18, the manufacturing history list 26 of the module battery 2 includes a control number 22*a* of the module battery 2 acquired from the operation result information 25 illustrated in FIG. 13, a serial number 25*a* of the single battery 11 mounted on the module battery 2, a determination result 26*a* as to the presence or absence of abnormality of the operation result in the operation result monitoring processing unit 8 (FIG. 1), management numbers (hereinafter, these are referred to as management numbers of positive electrode materials) of various blending materials and the positive electrode acquired from the manufacturing history information 20 in each single battery 11 acquired from the manufacturing quality management database 6 (FIG. 1), and management numbers (hereinafter, these are referred to as management numbers of negative electrode materials) of various blending materials and the negative electrode in the same manner as in the positive electrode (the above management numbers are collectively referred to as management numbers of positive electrode and negative electrode materials).

Returning to FIG. 17, next, based on the manufacturing history list 26 created with respect to the module battery 2, in a single battery in which control numbers of positive electrode and negative electrode materials are equal to those of the positive electrode and negative electrode materials included in the manufacturing history list 26, the manufacturing/usage environment factor classification processing unit 9 acquires the manufacturing quality information (the manufacturing history information 20 illustrated in FIG. 8 and the manufacturing inspection information 21 illustrated in FIG. 9) of single batteries (hereinafter, it is referred to as the single batteries having the same manufacturing history information) 11 mounted on another module battery 2 from the manufacturing quality management database 6 (FIG. 1) (step S402). The manufacturing/usage environment factor classification processing unit 9 compares the manufacturing quality management information of single batteries (hereinafter, these are referred to as the single batteries) 11 mounted on the module battery 2, particularly, the manufacturing inspection information 21 with the manufacturing quality management information of the single battery 11 having the same manufacturing history information, particularly, the manufacturing inspection information 21 (step S403).

As a result of this comparison, the manufacturing/usage environment factor classification processing unit 9 determines whether a significant difference is present between the manufacturing quality management information of the single battery 11 and that of the same manufacturing history single battery 11. If the significant difference is present ("Yes" at step S404), or even if the significant difference is not present ("No" at step S404), the manufacturing/usage environment factor classification processing unit 9 notifies the diagnosis result creation processing unit 10 (FIG. 1) of the determination result representing the effect (step S205 of FIG. 14).

As illustrated in FIG. 9, the product inspection information 21 of the single battery 11 here includes the control number, inspection date and time, and performance data such as capacitance and voltage as the inspection items of the single battery 11. As to the determination whether a significant difference is present in the performance data, the manufacturing/usage environment factor classification processing unit 9 calculates an average value and a standard deviation of the performance data of the single battery 11 having the same control number and manufacturing history information as a population. The manufacturing/usage environment factor classification processing unit 9 determines that the performance data of each single battery 11 deviated from the upper and lower limit thresholds represented by the following formula 2, namely, the range set by Upper limit threshold for determining significant difference=average value+$k$*standard deviation Lower limit threshold for determining significant difference=average value−$k$*standard deviation (Formula 2)

and determined by the upper and lower limit thresholds has a significant difference (step S404). A coefficient k is arbitrarily set and a value of approximately 3 or 4 is normally set. Further, the upper and lower limit thresholds are created in each control number of various components and materials included in the manufacturing history list, and in each type of the performance data of the single battery 11.

The comparison processing of this manufacturing significant difference is performed in each control number of various components and materials included in the manufacturing history list 26, and in each type of the performance data of the single battery.

The manufacturing/usage environment factor classification processing unit 9 determines the presence or absence of the manufacturing factor based on the determination result of a significant difference, and terminates the manufacturing/usage environment factor classification processing (processing of step S203 of FIG. 14) of the operation abnormality.

Figure 19:
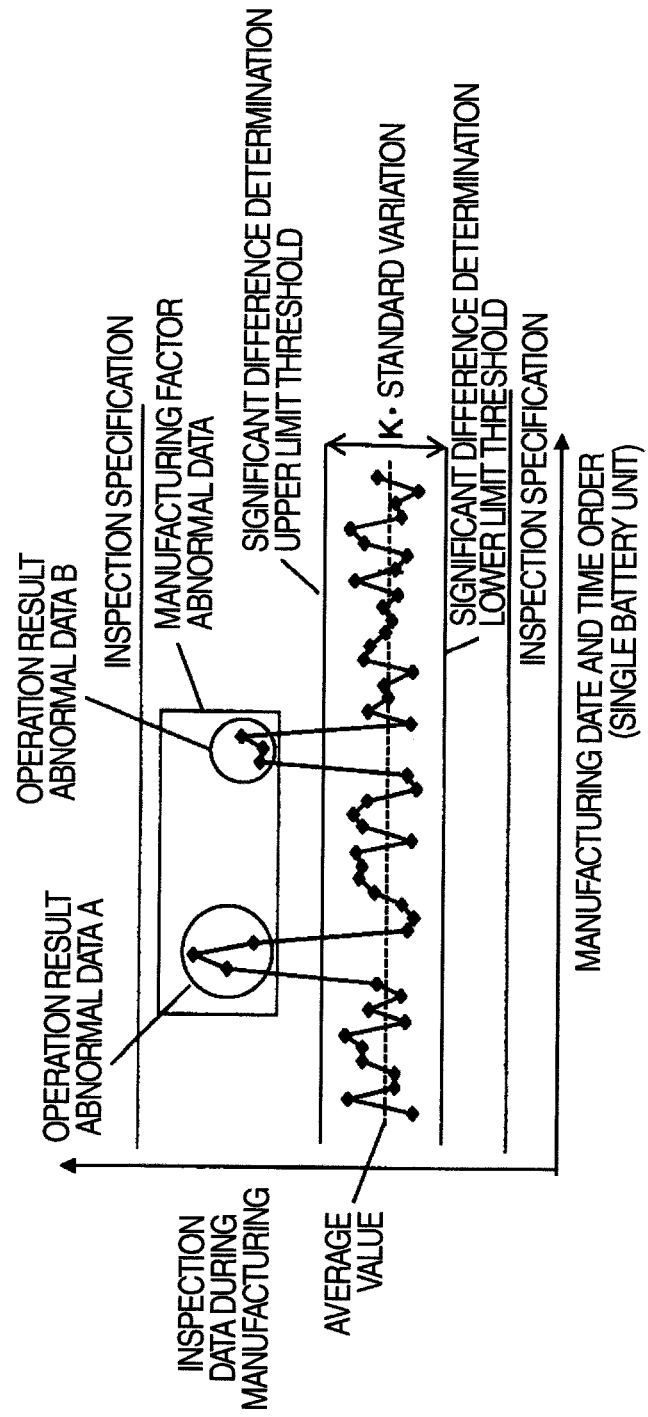
FIG. 19 illustrates one specific example of comparison processing on a significant difference of manufacturing quality at step S403 of FIG. 17.

FIG. 19 illustrates one specific example of the comparison processing of the significant difference in the manufacturing quality at step S403 of FIG. 17.

In FIG. 19, as described above, the manufacturing/usage environment factor classification processing unit 9 calculates the upper and lower limit thresholds for determining the significant difference by using the above-described formula 2 from the average value and standard deviation of the performance data of the single battery 11 and that of the single battery 11 having the same manufacturing history. The performance data of these single batteries 11 is indicated by the black circle with respect to the range of the significant difference set by the upper and lower limit thresholds for determining the significant difference. FIG. 19 illustrates that the performance data A of the single battery 11 and the performance data B of one single battery 11 having the same manufacturing history are deviated from the range of the significant difference.

As described above, in the comparison processing of step S403 of FIG. 17, the manufacturing/usage environment factor classification processing unit 9 determines whether the performance data of the single battery 11 is deviated from the range of the acquired significant difference, or the performance data of the single batteries 11 having the same manufacturing history other than the above single battery 11 is deviated from the range of the significant difference. If the performance data of the single battery 11 is deviated from the range of the significant difference, the module battery 2 using the single battery 11 in which the operation result monitoring processing unit 8 (FIG. 1) determines that the operation result information is abnormal is abnormal due to the manufacturing factor. In the case where there is used the single battery 11 having the same manufacturing history in which the operation result monitoring processing unit 8 determines that the performance data is deviated from the range of the significant difference, the other module batteries 2 using the single battery 11 having the same manufacturing history are abnormal due to the manufacturing factor is also determined.

Accordingly, according to the comparison processing using this significant difference, there is obtained at least any determination result of (1) the module battery 2 is abnormal due to the manufacturing factor, however, the module battery 2 which is abnormal due to the manufacturing factor is not present among the other module batteries 2 using the single battery 11 having the same manufacturing history as that of the module battery 2, (2) the module battery 2 is abnormal due to the manufacturing factor, and at the same time, the other module batteries 2 using the single battery 11 having the same manufacturing history as that of the module battery 2 are also abnormal due to the manufacturing factor, and (3) the abnormality of the module battery 2 is not caused by the manufacturing factor; however, the module battery 2 which is abnormal due to the manufacturing factor is present among the other module batteries 2 using the single battery 11 having the same manufacturing history as that of the module battery 2 (in this case, the module battery 2 is abnormal due to the usage environment factor).

In this way, based on the manufacturing quality information relating to the single battery 11 of the module battery 2 and the manufacturing quality information relating to the module battery from the manufacturing quality management database 6 (FIG. 1), the manufacturing/usage environment factor classification processing unit 9 (FIG. 1) determines whether the abnormality is present due to the manufacturing factor or the usage environment factor, with respect to the module battery 2 in which the operation result monitoring processing unit 8 (FIG. 1) determines that the abnormality is present in the operation result information of the module battery 2 ("Yes" at step S202 of FIG. 14). Also relating to the other module batteries 2 using the single battery 11 having the same manufacturing history as that of the module battery 2, the manufacturing/usage environment factor classification processing unit 9 further detects whether the abnormality is present due to the manufacturing factor.

Figure 20:
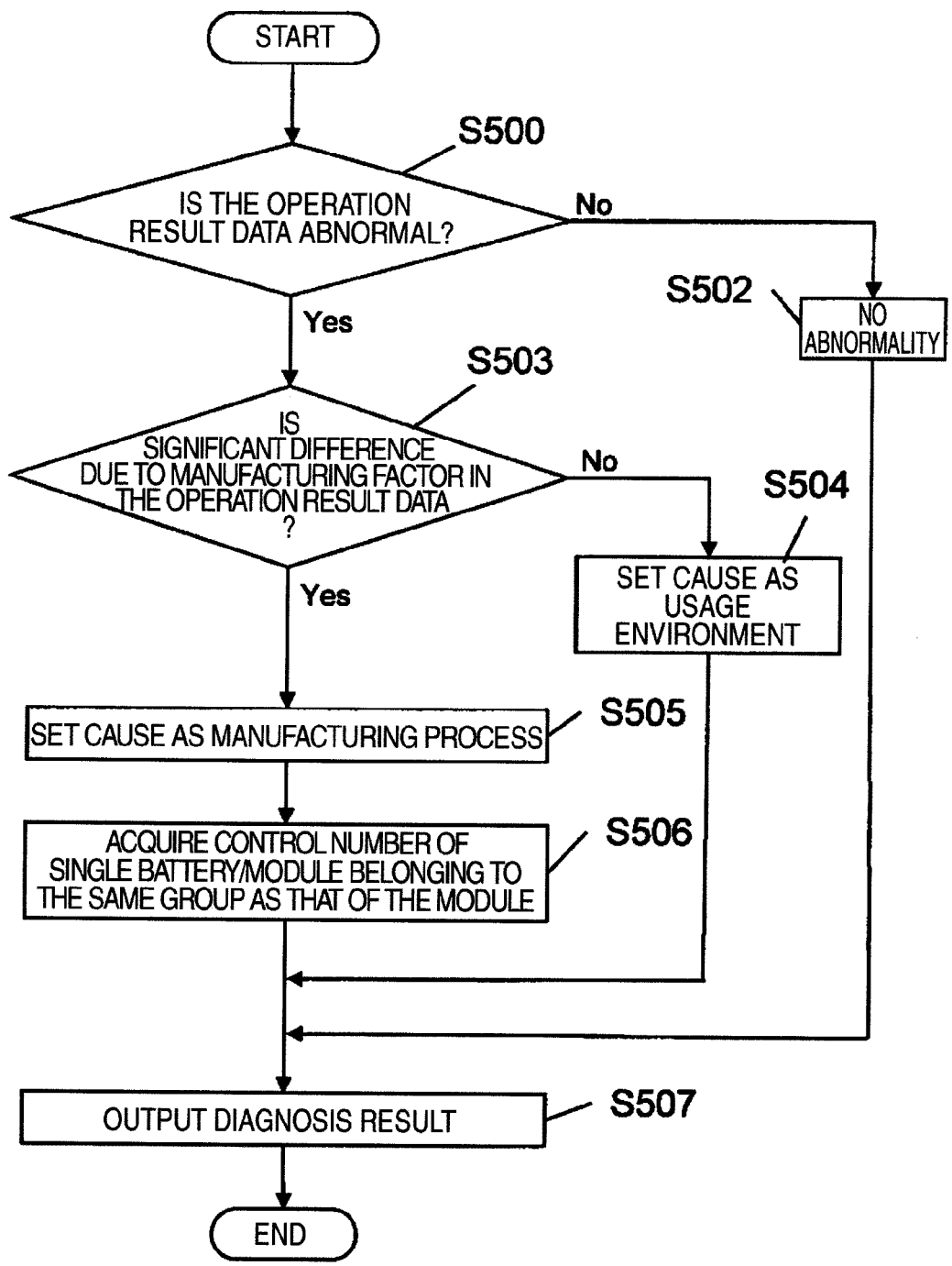
FIG. 20 is a flowchart illustrating one specific example of step S206 for diagnosis result creation processing of FIG. 14 through a diagnosis result creation processing unit 10 of FIG. 1.

FIG. 20 is a flowchart illustrating one specific example of step S206 of the diagnosis result creation processing of FIG. 14 through the diagnosis result creation processing unit 10 of FIG. 1.

In FIG. 20, based on the processing result (also including the determination result of the operation result monitoring processing unit 8 (FIG. 1)) from the manufacturing/usage environment factor classification processing unit 9 (FIG. 1), the diagnosis result creation processing unit 10 determines whether the operation result abnormality is present in the module battery 2 to be diagnosed (step S500). According to the processing of the operation result monitoring processing unit 8 (FIG. 1), if the operation result abnormality is not present in the module battery 2 ("No" at step S500), the diagnosis result creation processing unit 10 determines that the abnormality is not present in the module battery 2 (step S502) and outputs the diagnosis result to display it on the screen (step S507).

If the operation result abnormality is present in the module battery 2 is determined through the processing of the operation result monitoring processing unit 8 (FIG. 1) ("Yes" at step S500), the diagnosis result creation processing unit 10 (FIG. 1) uses the determination result obtained from the processing of step S204 of FIG. 14 through the manufacturing/usage environment factor classification processing unit 9 (FIG. 1), namely, the determination result (the determination result whether the single battery 11 is present in which the significant difference of the manufacturing factor is present in the module battery 2) whether the single battery 11 the product inspection information of which is deviated from the range of the significant difference illustrated in FIG. 19 among the single batteries 11 of the module battery 2. If the significant difference is not present ("No" at step S503), the diagnosis result creation processing unit 10 determines that the operation result abnormality of the module battery 2 to be diagnosed is present due to the usage environment factor (step S504), and outputs the diagnosis result to display it on the screen (step S507).

As compared with the above, if the significant difference is present ("Yes" at step S503), the diagnosis result creation processing unit 10 sets the operation result abnormality of the module battery 2 to be diagnosed as the manufacturing factor (namely, the manufacturing process) (step S505). Based on the determination result of step S404 of FIG. 17 through the manufacturing/usage environment factor classification processing unit 9 (FIG. 1), in the case where the same manufacturing history single battery 11 having the significant difference of the manufacturing factor (namely, abnormality is present due to the manufacturing factor) is present among the single batteries 11 having the same manufacturing history as that of the single battery 11 of the module battery 2, the diagnosis result creation processing unit 10 acquires the control number of the same manufacturing history single battery 11 and the control numbers of the other module batteries 2 using the same manufacturing history single battery 11 (step S506). If the same manufacturing history single battery 11 as described above is present, the diagnosis result creation processing unit 10 outputs as the diagnosis result the effect that the abnormality of the operation result information of the module battery 2 is present due to the manufacturing factor along with the control number and the control numbers of the other module batteries 2 to display them on the screen (step S507). The diagnosis result creation processing unit 10 adds a name and control number of component or material in which the significant difference of the manufacturing factor is present and a type of the product inspection to the diagnosis result.

FIG. 21 illustrates one specific example of an output screen of the diagnosis result in which a significant difference of the manufacturing factor obtained at step S507 of FIG. 20 is determined.

In FIG. 21, the diagnosis result creation processing unit 10 here outputs the control number of the module battery 2 (here, "M01"), the control numbers of the single batteries 11 mounted on the module battery 2 (here, "B01", "B02", "B03", "B15", "B16", and "B17"), the operation abnormality in each single battery 11 (the presence or absence of the abnormality on the operation result information), the presence or absence of the significant difference on the manufacturing factor, the manufacturing factor item to be determined of the significant difference, a type of the product inspection used for determination of the significant difference, and the inspection data value. Examples of the manufacturing factor item include control numbers of the positive electrode and the blending material, and examples of the inspection data value include capacitance during the inspection before shipping of the module battery 2.

FIG. 22 illustrates one specific example of diagnosis results of the module battery 2 to be diagnosed in which a screen created by the diagnosis result creation processing unit 10 of FIG. 1 is displayed, and a reference numeral 27 denotes a diagnosis result screen.

In FIG. 22, a diagnosis date and time 27*a* at which diagnosis processing is performed, a control number 27*b* of the module battery 2 in which the diagnosis processing is performed, control numbers 27*c* of the single batteries mounted on the module battery 2, the presence or absence of abnormality of the operation result information 27*d*, and the manufacturing factor determination 27*e* illustrating the presence or absence of abnormality due to the manufacturing factor are displayed on the diagnosis result screen 27 to be displayed.

In the case where the abnormality due to the manufacturing factor is present, an item 27*f* of the manufacturing factor in which the abnormality is present, and the control numbers 27*g* of the single batteries 11 mounted on the module battery 2 having a significant difference on the manufacturing factor other than the module battery 2 are further output.

Figure 23:
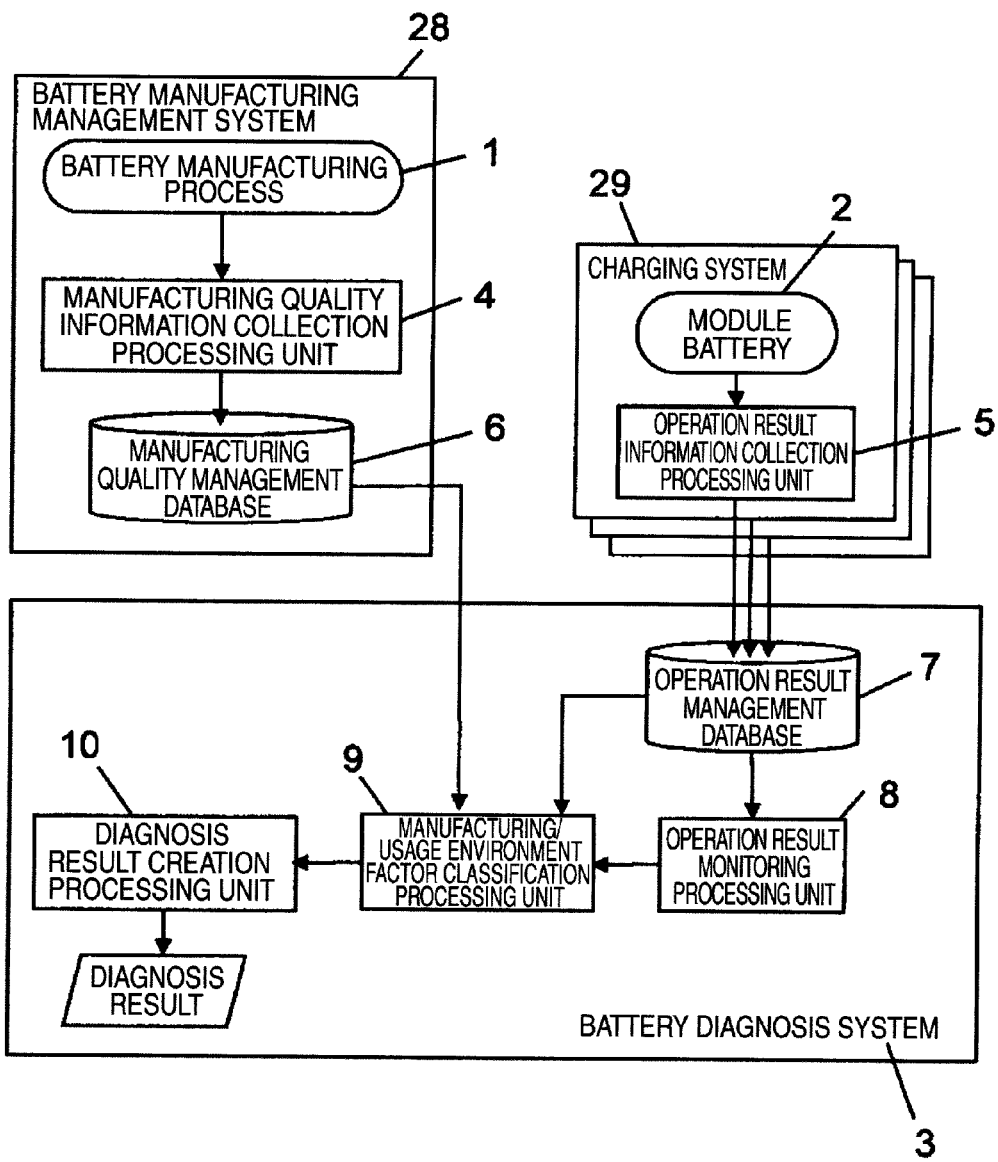
FIG. 23 is a block diagram illustrating a second embodiment of a diagnosis system and diagnosis method for a lithium ion secondary battery of the present invention.

FIG. 23 is a block diagram illustrating a second embodiment of the diagnosis system and diagnosis method of the lithium ion secondary battery of the present invention, and a reference numeral 28 denotes a battery manufacturing management system, and a reference numeral 29 denotes a charging system. The same circuit elements as those of FIG. 1 are indicated by the same reference numerals as those of FIG. 1, and the overlapping description will be omitted.

In FIG. 23, the second embodiment has a configuration in which the battery diagnosis system 3, the battery manufacturing management system 28, and the charging system 29 are connected via a network. The battery manufacturing management system 28 includes the battery manufacturing process 1, the manufacturing quality information collection processing unit 4, and the manufacturing quality management database 6. The battery diagnosis system 3 includes the operation result management database 7, the operation result monitoring processing unit 8, the manufacturing/usage environment factor classification processing unit 9, and the diagnosis result creation processing unit 10. The charging system 29 includes the operation result information collection processing unit 5.

In the battery manufacturing management system 28, the manufacturing quality information created from data of the single battery 11 and module battery 2 collected from the battery manufacturing process 1 by the manufacturing quality information collection processing unit 4 is stored in the manufacturing quality management database 6. As described above, the manufacturing quality information collection processing unit 4 and the manufacturing quality management database 6 are incorporated into the battery manufacturing management system 28 which performs accumulation of the manufacturing results (the lot number and wafer number, a name of the manufacturing device, and start date and time and end date and time) in each process for manufacturing the lithium ion secondary battery, management of the manufacturing flow, and the manufacturing instruction of the next process, and each process is performed.

When the module battery 2 is attached to the charging system 29 for charging, the operation result information collection processing unit 5 collects the operation result information of the module battery 2 and transmits it to the battery diagnosis system 3 via a network. When acquiring the operation result information from the module battery 2, the battery diagnosis system 3 stores and holds it in the operation result management database 7. At the same time, the operation result monitoring processing unit 8 determines whether the abnormality is present in the operation result information. If the abnormality is present, the manufacturing/usage environment factor classification processing unit 9 acquires the manufacturing quality information of the module battery 2 and that of the single batteries 11 mounted thereon from the manufacturing quality management database 6 of the battery manufacturing management system 28. In the single battery 11 of the module battery 2, the manufacturing/usage environment factor classification processing unit 9 further determines whether the manufacturing factor for causing the abnormality is present in the operation result information. If the manufacturing factor is present, the manufacturing/usage environment factor classification processing unit 9 determines that the abnormality due to the manufacturing factor is present in the operation result information. If the manufacturing factor is not present, the manufacturing/usage environment factor classification processing unit 9 determines that the abnormality due to the usage environment factor is present in the operation result information. The manufacturing/usage environment factor classification processing unit 9 provides the determination result to the diagnosis result creation processing unit 10, and allows it to create a screen of the diagnosis results illustrated in FIGS. 21 and 22. In the same manner as in the first embodiment illustrated in FIG. 1, the manufacturing/usage environment factor classification processing unit 9 acquires information relating to the single battery having the same manufacturing history as that of the single battery 11 which is mounted on the module battery 2 and determined to be abnormal due to the manufacturing factor and information relating to the other module batteries 2 using the above single battery, and provides them to the diagnosis result creation processing unit 10.

As can be seen from the above sequence, also in the second embodiment, the processing unit and database are partially provided on a system different from that of the first embodiment. The same operations as those of the first embodiment are performed, and the same effect as that of the first embodiment is obtained.

Figure 24:
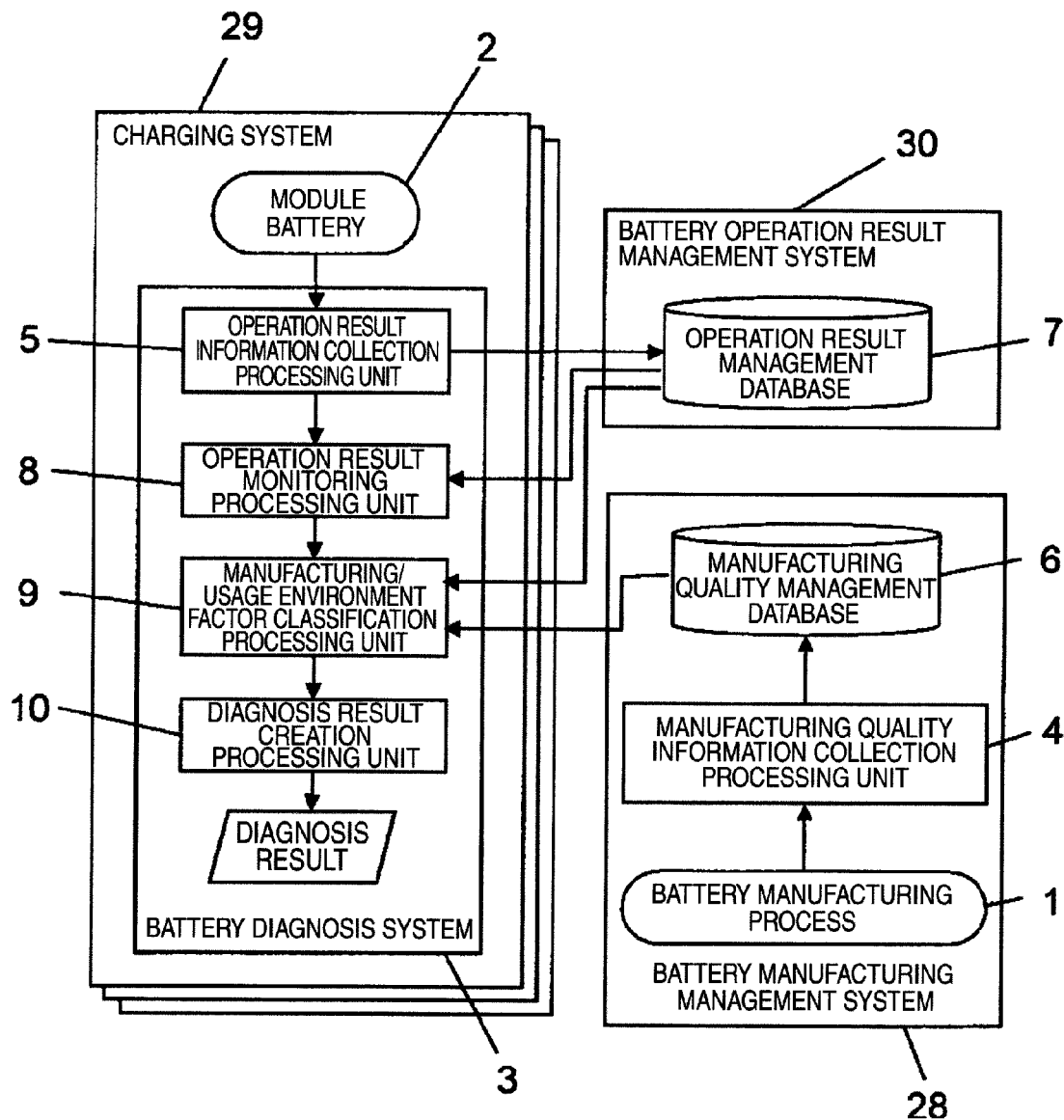
FIG. 24 is a block diagram illustrating a third embodiment of a diagnosis system and diagnosis method for a lithium ion secondary battery of the present invention.

FIG. 24 is a block diagram illustrating a third embodiment of a diagnosis system and diagnosis method of the lithium ion secondary battery of the present invention, and a reference numeral 30 denotes a battery operation result management system. The same circuit elements as those of FIGS. 1 and 23 are indicated by the same reference numerals as those of FIGS. 1 and 23, and the overlapping description will be omitted.

In FIG. 24, in the third embodiment, also the battery diagnosis system 3 excluding the operation result management database 7 is incorporated into the charging system 29, and the operation result management database 7 is provided in the battery operation result management system 30 in the second embodiment illustrated in FIG. 23. These charging system 29, battery operation result management system 30, and battery manufacturing management system 28 are connected via a network. The battery diagnosis system 3 acquires information necessary for diagnosis processing from the manufacturing quality management database 6 in the battery manufacturing management system 28 and the operation result management database 7 in the battery operation result management system 13, and performs the same operations as in the above embodiments.

It should be further understood by those skilled in the art that although the foregoing description has been made on embodiments of the invention, the invention is not limited thereto and various changes and modifications may be made without departing from the spirit of the invention and the scope of the appended claims.

REFERENCE SIGNS LIST

1 Manufacturing process
1*a* Material acceptance process
1*b* Electrode manufacturing process
1*c* Single battery assembling process
1*d* Single battery inspection process
1*e* Module assembling process
1*f* Module inspection process
2 Module battery in operation (under a usage environment)
3 Battery diagnosis system
4 Manufacturing quality information collection processing unit
5 Operation result information collection processing unit
6 Manufacturing quality management database
7 Operation result management database
8 Operation result monitoring processing unit
9 Manufacturing/usage environment factor classification processing unit
10 Diagnosis result creation processing unit
11 Single battery
12 Control number mark
13 Laminaire
14 Positive electrode
15 Negative electrode
16 Battery can
17 Control number mark
18 Controller
20 Manufacturing history information of single battery 11
21 Product inspection information of single battery 11
22 Manufacturing history information of module battery 2
23 Product inspection information of module battery 2
24, 25 Operation result information
26 Manufacturing history list
27 Diagnosis result screen
28 Battery manufacturing management system
29 Charging system
30 Battery operation result management system
100 Lithium ion secondary battery
100*a* Battery can
101 Positive electrode
101*a* Positive electrode active material
102 Negative electrode
102*a* Negative electrode active material
103 Separator
104 Electrolyte

The invention claimed is:

1. A diagnosis system for a lithium ion secondary battery comprising:
    a manufacturing quality information collection processing unit which collects manufacturing quality information from manufacturing processes of a single battery and module battery using the single battery of a lithium ion secondary battery;
    a manufacturing quality management database which stores the manufacturing quality information collected by the manufacturing quality information collection processing unit;
    an operation result information collection processing unit which collects operation result information from the module battery in operation under a usage environment;
    an operation result database which stores the operation result information collected by the operation result information collection processing unit;
    an operation result monitoring processing unit which monitors an operation condition of the module battery by using the operation result information;
    a manufacturing/usage environment factor classification processing unit which determines, based on the manufacturing quality information in the manufacturing quality management database and the operation result information in the operation result database, whether an abnormality factor of an operation result detected by the operation result monitoring processing unit is caused by a usage environment factor or a manufacturing factor; and a diagnosis result creation processing unit which creates a diagnosis result of the module battery to be diagnosed based on a processing result of the operation result monitoring processing unit and a processing result of the manufacturing/usage environment factor classification processing unit.

2. The diagnosis system for a lithium ion secondary battery according to claim 1, wherein:

the operation result information collection processing unit collects the operation result information of the module battery after a charging completion of the module battery; and when the operation result monitoring processing unit detects, based on the operation result information collected by the operation result information collection processing unit, that abnormality of operation results is present, the manufacturing/usage environment factor classification processing unit determines whether an abnormality factor of the operation result is caused by the usage environment factor or the manufacturing factor.

3. The diagnosis system for a lithium ion secondary battery according to claim 2, wherein:

the manufacturing quality information collection processing unit and the manufacturing quality management database are provided in a battery manufacturing management system having a manufacturing process for manufacturing the module;

the operation result information collection processing unit is provided in a charging system which charges the module battery, and the operation result database, the operation result monitoring processing unit, the manufacturing/usage environment factor classification processing unit, and the diagnosis result creation processing unit configure a battery diagnosis system; and the battery manufacturing management system, the charging system, and the battery diagnosis system are connected via a network.

4. The diagnosis system for a lithium ion secondary battery according to claim 2, wherein:

the manufacturing quality information collection processing unit and the manufacturing quality management database are provided in a battery manufacturing management system having a manufacturing process for manufacturing the module;

the operation result database is provided in a battery operation result management system;

the operation result information collection processing unit, the operation result monitoring processing unit, the manufacturing/usage environment factor classification processing unit, and the diagnosis result creation processing unit are provided in a charging system which charges the module battery; and the battery manufacturing management system, the battery operation result management system, and the charging system are connected via a network.

5. The diagnosis system for a lithium ion secondary battery according to claim 1, wherein:

the manufacturing quality information collection processing unit and the manufacturing quality management database are provided in a battery manufacturing management system having a manufacturing process for manufacturing the module;

the operation result information collection processing unit is provided in a charging system which charges the module battery, and the operation result database, the operation result monitoring processing unit, the manufacturing/usage environment factor classification processing unit, and the diagnosis result creation processing unit configure a battery diagnosis system; and the battery manufacturing management system, the charging system, and the battery diagnosis system are connected via a network.

6. The diagnosis system for a lithium ion secondary battery according to claim 1, wherein:

the manufacturing quality information collection processing unit and the manufacturing quality management database are provided in a battery manufacturing management system having a manufacturing process for manufacturing the module;

the operation result database is provided in a battery operation result management system; and the operation result information collection processing unit, the operation result monitoring processing unit, the manufacturing/usage environment factor classification processing unit, and the diagnosis result creation processing unit are provided in a charging system which charges the module battery; and the battery manufacturing management system, the battery operation result management system, and the charging system are connected via a network.

7. A diagnosis method for a lithium ion secondary battery comprising:

a first step of collecting operation result information of a module battery of a lithium ion secondary battery in operation by using an operation result information collection unit;

a second step of determining, based on an operation result monitoring unit, whether abnormality is present in the operation result information of the acquired module battery;

a third step of acquiring manufacturing quality information of the module battery in which the abnormality is present in the operation result information and the manufacturing quality information of single batteries thereof by using a manufacturing/usage environment factor classification unit and determining, based on comparison processing of product inspection information of the manufacturing quality information, whether a significant difference of a manufacturing factor is present; and a fourth step of creating a diagnosis result of the module battery based on processing results of the operation result monitoring unit and the manufacturing/usage environment factor classification unit, and wherein a series of processing including the first to fourth steps is performed.

* * * * *